United States Patent
Xu et al.

(10) Patent No.: US 10,497,625 B2
(45) Date of Patent: Dec. 3, 2019

(54) METHOD AND APPARATUS OF MULTI THRESHOLD VOLTAGE CMOS

(71) Applicant: QUALCOMM Incorporated, San Diego, CA (US)

(72) Inventors: Jeffrey Junhao Xu, San Diego, CA (US); Choh Fei Yeap, Hsinchu (TW)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 15/880,512

(22) Filed: Jan. 25, 2018

(65) Prior Publication Data
US 2018/0166340 A1 Jun. 14, 2018

Related U.S. Application Data

(62) Division of application No. 14/498,180, filed on Sep. 26, 2014, now Pat. No. 9,922,880.

(51) Int. Cl.
| | |
|---|---|
| *H01L 21/8234* | (2006.01) |
| *H01L 21/02* | (2006.01) |
| *H01L 21/28* | (2006.01) |
| *H01L 21/3213* | (2006.01) |
| *H01L 27/088* | (2006.01) |
| *H01L 29/161* | (2006.01) |
| *H01L 29/49* | (2006.01) |
| *H01L 29/51* | (2006.01) |

(52) U.S. Cl.
CPC .. *H01L 21/82345* (2013.01); *H01L 21/02244* (2013.01); *H01L 21/02532* (2013.01); *H01L 21/28088* (2013.01); *H01L 21/32133* (2013.01); *H01L 21/823431* (2013.01); *H01L 27/0886* (2013.01); *H01L 29/161* (2013.01); *H01L 29/4966* (2013.01); *H01L 29/517* (2013.01)

(58) Field of Classification Search
CPC ....... H01L 21/82345; H01L 21/823431; H01L 29/495–4975
See application file for complete search history.

(56) References Cited

U.S. PATENT DOCUMENTS

| | | | |
|---|---|---|---|
| 8,169,027 B2 | 5/2012 | Doyle et al. | |
| 8,309,447 B2 | 11/2012 | Cheng et al. | |
| 8,679,906 B2 | 3/2014 | Cheng | |

(Continued)

OTHER PUBLICATIONS

Bersch E., "Energy Level Alignment in Metal/Oxide/Semiconductor and Organic Dye/Oxide Systems", Graduate School—New Brunswick Electronic Theses and Dissertations, Rutgers, The State University of New Jersey, Oct. 2008, 179 Pages.

(Continued)

*Primary Examiner* — Stephen M Bradley
(74) *Attorney, Agent, or Firm* — MG-IP Law, P.C.

(57) ABSTRACT

A first and a second instance of a common structured stack are formed, respectively, on a first fin and a second fin. The common structured stack includes a work-function metal layer, and a barrier layer. The barrier layer of the first instance of the common structured stack is etched through, and the work-function metal layer of the first instance of the common structure is partially etched. The partial etch forms a thinner work-function metal layer, having an oxide of the work-function metal as a new barrier layer. A gate element is formed on the new barrier layer.

6 Claims, 17 Drawing Sheets

(56) References Cited

U.S. PATENT DOCUMENTS

| | | |
|---|---|---|
| 9,159,626 B2 | 10/2015 | Lin et al. |
| 9,177,865 B2 | 11/2015 | Kim et al. |
| 9,209,186 B1 | 12/2015 | Togo et al. |
| 9,362,180 B2 | 6/2016 | Lee et al. |
| 2007/0138563 A1 | 6/2007 | Callegari et al. |
| 2009/0078997 A1 | 3/2009 | Greene et al. |
| 2012/0329262 A1 | 12/2012 | Na et al. |
| 2013/0334690 A1 | 12/2013 | Tsai et al. |
| 2014/0054717 A1 | 2/2014 | Edge et al. |
| 2014/0070322 A1 | 3/2014 | Jacob et al. |
| 2014/0103438 A1 | 4/2014 | Wang et al. |
| 2014/0239407 A1* | 8/2014 | Manabe ............ H01L 27/0922 257/369 |
| 2015/0214112 A1 | 7/2015 | Zhao |
| 2015/0243658 A1 | 8/2015 | Joshi et al. |
| 2015/0357244 A1 | 12/2015 | Ragnarsson et al. |
| 2016/0013288 A1 | 1/2016 | Cheng et al. |
| 2016/0093535 A1 | 3/2016 | Xu et al. |
| 2016/0093536 A1 | 3/2016 | Yang et al. |
| 2016/0104786 A1* | 4/2016 | Yang ................ H01L 29/4966 257/369 |
| 2016/0307896 A1 | 10/2016 | Lin et al. |

OTHER PUBLICATIONS

Efavi J.K., et al., "Tungsten Work Function Engineering for Dual Metal Gate Nano-CMOS", Journal of Materials Science: Materials in Electronics, Kluwer Academic Publishers, Bo, vol. 16, No. 7, Jul. 1, 2005 (Jul. 1, 2005), pp. 433-436, XP019211872, ISSN: 1573-482X, DOI: 10.1007/S10854-005-2310-8 abstract.

International Search Report and Written Opinion—PCT/US2015/050882—ISA/EPO—dated Jan. 4, 2016.

Li Z., et al., "Oxygen Incorporation in Tin for Metal Gate Work Function Tuning with a Replacement Gate Integration Approach", Microelectronic Engineering, Elsevier Publishers Bv., Amsterdam, NI, vol. 87, No. 9, Nov. 1, 2010 (Nov. 1, 2010), pp. 1805-1807, XP027048279, ISSN: 0167-9317 [retrieved on Oct. 24, 2009] *Section "1. Introduction"; "2. Experiment".

Matsukawa T., et al., "Dual Metal Gate FinFET Integration by Ta/Mo Diffusion Technology for Vt Reduction and Multi-Vt CMOS Application", Solid State Electronics, Elsevier Science Publishers, Barking, GB, vol. 53, No. 7, Jul. 1, 2009 (Jul. 1, 2009), pp. 701-705, XP026145459, ISSN: 0038-1101, DOI: 10.1016/J.SSE.2009.02.013 [retrieved on Apr. 24, 2009].

Xiang J., et al., "Growth Mechanism of Atomic-Layer-Deposited TiAlC Metal Gate Based on TiCl4 and TMA Precursors", Chinese Physics B, Bristol GB, vol. 25, No. 3, Mar. 8, 2016, XP020298757, 3 pages.

* cited by examiner

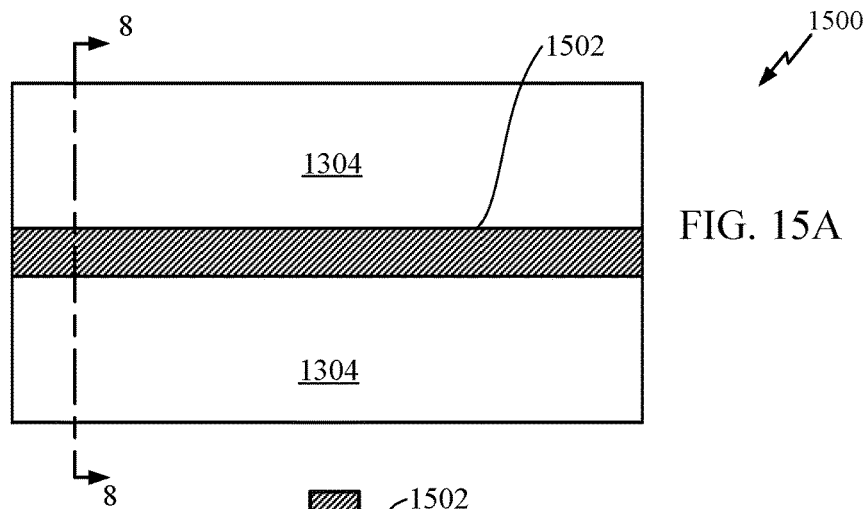
FIG. 15A
FIG. 15B
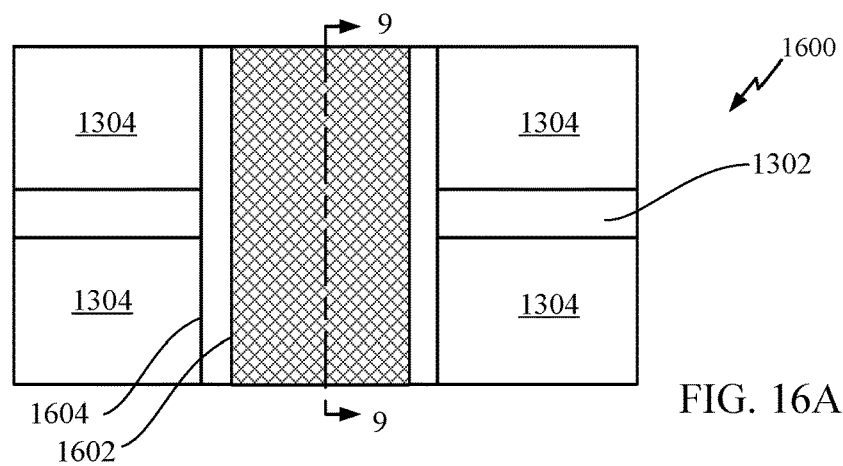
FIG. 16A
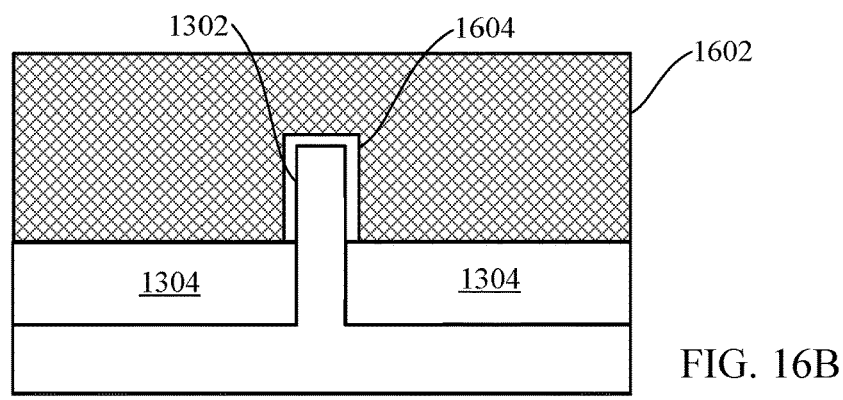
FIG. 16B

METHOD AND APPARATUS OF MULTI THRESHOLD VOLTAGE CMOS

CROSS-REFERENCE TO RELATED APPLICATIONS

The present application is a divisional of U.S. patent application Ser. No. 14/498,180, entitled "METHOD AND APPARATUS OF MULTI THRESHOLD VOLTAGE CMOS," filed Sep. 26, 2014, the contents of which are hereby expressly incorporated by reference in their entirety.

FIELD OF DISCLOSURE

The technical field of the disclosure relates to field effect transistor (FETs) and, more specifically, to fin-shaped field effect transistors (FinFETs).

BACKGROUND

Conventional techniques are used in large scale integrated circuit chips, such as system-on-chip (SOC) devices, to provide different transistor devices with different voltage thresholds (hereinafter "Vt"). One reason is to reduce power consumption. For example, high Vt (hereinafter "HVT") devices may be used where timing is not a critical concern. On the other hand standard Vt (hereinafter "SVT") and low Vt (hereinafter "LVT) device may be used where timing is a critical concern. One conventional technique for varying the Vt in transistor devices is to vary the channel doping. However, the conventional technique of varying Vt by varying channel doping can have shortcomings. One is that is in smaller devices, such as FinFETs, the channel doping may provide a lower than desired range of Vt tuning. Another manifestation, particularly in FinFETs, can be a random dopant fluctuation, e.g., due to fabrication tolerances. The random dopant variation may cause unwanted variance in channel mobility, including an increase percentage of devices having unacceptable channel mobility.

One pursuit of a solution is to find a means to control the work-function of the gate. One conventional technique is to fabricate the gates of devices using different work-function metals. For example, one work-function metal may be used in the gate LVT devices, another in the gate of SVT devices, and still another in the gate of HVT devices. This conventional technique may be termed a "conventional multi work-function metal" technique. The conventional multi work-function metal technique, however, can have substantial shortcomings, such as a significant increase in complexity and cost of fabrication.

SUMMARY

The following summary touches on certain examples in accordance with one or more aspects. It is not a defining overview of all disclosed aspects. It is not intended to prioritize or even identify key features and elements of all aspects, or to limit the scope of any aspect.

Example methods according to one or more disclosed aspects can form a plurality of NMOS FinFET, having respectively different threshold voltages. In aspect, methods can include an in-process structure having a first fin and a second fin, and forming a first gate stack and a second gate stack. In a further aspect, the first gate stack may be over a gate surface of the first fin, and the second gate stack may be over a gate surface of the first fin. In an aspect, the first gate stack may include a first dielectric layer, a first capping layer, a first work-function metal layer, a first barrier layer, and a first gate electrode metal. In a related aspect, the second gate stack may include a second dielectric layer, a second capping layer, a second work-function metal layer, a second barrier layer, and a second gate electrode metal. In an aspect, the first work-function metal layer may be formed of a given work-function metal layer, and the second work-function metal layer may be formed of the same given work-function metal.

In methods according to one or more disclosed aspects, the first barrier may be a given barrier layer material and the second barrier layer may be an oxide of the given work-function metal. In an aspect, the second work-function metal layer may be formed from an interim work-function metal layer that may comprise the same work-function metal as the first work-function metal layer. In a further aspect, the second work-function metal layer may be formed by etching the interim work-function metal layer, and the second barrier layer may be formed as an oxide incidental to the etching, or associated with the etching.

Examples apparatuses according to one or more disclosed aspects may include a plurality of NMOS FinFETs, configured with particular features that, in combination, can provide respectively different threshold voltages. In an aspect a first NMOS FinFET may include a first fin and a first gate stack over a gate surface of the first fin, and a second NMOS FinFET, which may include a second fin and a second gate stack over a gate surface of the second fin. In an aspect the first gate stack may include a first dielectric layer, a first capping layer, a first work-function metal layer, a first barrier layer, and a first gate electrode metal. In a further aspect, the second gate stack may include a second dielectric layer, a second capping layer, a second work-function metal layer, a second barrier layer, and a second gate electrode metal. In an aspect, the first work-function metal layer may comprise given work-function metal, and the second work-function metal layer comprise the same given work-function metal. In a further aspect, the second barrier layer can be an oxide of the given work-function metal.

Example methods according to one or more disclosed aspects can form a plurality of PMOS FinFETs having respectively different threshold voltages. In an aspect, the plurality of PMOS FinFETs may have concurrent identically structured gate stacks, which may be formed of respectively identical materials. Example methods, according to an aspect, can include forming a plurality of fins, which can include a first Si fin and a second Si fin, and then forming in the first Si fin a first concentration of Ge, and forming in the second Si fin a second concentration of Ge. A result can be a first SiGe fin having the first concentration of Ge, and a second SiGe fin having the second concentration of Ge. In an aspect, a first PMOS FinFET may be formed using the first SiGe fin and a second PMOS FinFET may be formed using the second SiGe fin. In an aspect, forming the first include forming the first gate stack on a gate area of the first SiGe fin and forming the second PMOS FinFET may include forming a second gate stack on a gate area of the second SiGe fin. In an aspect, the first gate stack may be formed with a first work-function metal layer, and the second gate stack with a second work-function metal layer. In a further aspect, the first work-function metal layer and the second work-function metal layer may have a mutually approximately identical thickness and may comprise a mutually identical work-function metal. In an additional aspect, the first concentration of Ge from the second concentration of Ge, establishes, at least in part, a threshold voltage of the second PMOS FinFET that is lower than a threshold voltage of the first PMOS FinFET.

Example methods according to one or more aspects can form a plurality of NMOS FinFETs having different threshold voltages. In an aspect, an in-process structure can be formed, having a first fin and a second fin. Example methods can include forming a dielectric layer, and forming a capping layer on the dielectric layer. In an aspect, the dielectric layer may comprise a high-K dielectric, and a first portion of the dielectric layer may be over a gate area of the first fin and a second portion of the dielectric layer may be over a gate area of the second fin. In a further aspect, a first portion of the capping layer may be on the first portion of the dielectric layer, and a second portion of the capping layer may be on the second portion of the dielectric layer. Example methods, according to an aspect, can include forming a work-function metal layer, with a first portion of the work-function metal layer on the first portion of the capping layer and has a second portion of the work-function metal layer on the second portion of the capping layer. In an aspect, the work-function metal layer may comprise a given work-function metal. Example methods, according to an aspect, can include forming a barrier layer, comprising a barrier material, with a first portion of the barrier layer on the first portion of the work-function metal layer and a second portion of the barrier layer on the second portion of the work-function metal layer. Example methods, according to an aspect, can further etching through the second portion of the barrier layer, and etching into the second portion of the work-function metal layer. In a further aspect, etching into the second portion of the work-function metal layer may form a remaining second portion of the work-function metal layer and, on a surface of the remaining second portion the work-function metal layer, a new barrier layer. In an aspect the new barrier layer may comprise an oxide of the work-function metal. Example methods, in a further aspect, can include forming a first NMOS FinFET having the first fin and a first gate element on the first portion of the barrier layer, and a second NMOS FinFET having the second fin and a second gate element on the new barrier layer.

A more complete understanding of the present invention, as well as further features and advantages of the invention, will be apparent from the following Detailed Description and the accompanying drawings.

BRIEF DESCRIPTION OF THE DRAWINGS

The accompanying drawings found in the attachments are presented to aid in the description of embodiments of the invention and are provided solely for illustration of the embodiments and not limitation thereof.

FIG. 15A shows a top projection view of one in-process structure, for subsequent processing into an HVT PMOS FinFET, with high concentration Ge, illustrating aspects of Ge tuning of Vt in multi-Vt PMOS FinFETs according to various exemplary embodiments.

FIG. 15B is a cross-sectional view, on the FIG. 15A cut plane 8-8.

FIG. 16A shows a top projection view of one in-process structure for an HVT PMOS FinFET according to various exemplary embodiments, illustrating a dummy gate and spacers on the FIG. 13A-13B in-process structure.

FIG. 16B is a cross-sectional view, on the FIG. 16A cut plane 9-9.

DETAILED DESCRIPTION

Figure 1:
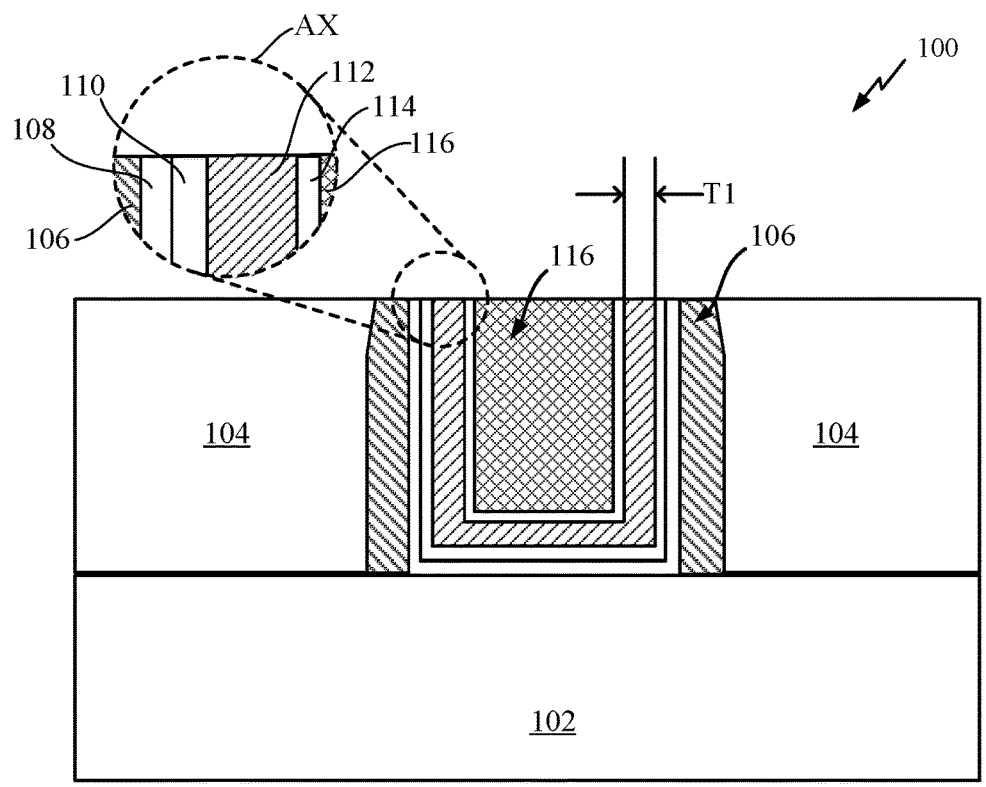
FIG. 1 shows a front cross-sectional view of one LVT NMOS illustrating aspects of multi-Vt FinFET devices and methods according to various exemplary embodiments.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields, electron spins particles, electrospins, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

One example method may provide ready tuning of Vt for FinFETs, usable in a wide range of applications and that provides advantages that include, but are not limited to, substantial sharing and concurrency of processing operations, minimal additional processing steps, ready control of the adjustment parameters, and a wide tuning range.

To avoid obfuscation by details not helpful to an understanding of concepts, example operations will be described for two simplified cases. The first simplified case is a fabrication of two n-channel metal-oxide-semiconductor (NMOS) fin-shaped field effect transistors (FinFETs), one being an LVT NMOS FinFET and the other being an SVT/HVT NMOS FinFET. Example aspects, as will be described in further detail, include the fabrication of the LVT NMOS FinFET and the SVT/HVT NMOS FinFET using the same starting structure, and sharing many operations in their respective fabrication. The example fabrication of the LVT NMOS FinFET and SVT/HVT NMOS FinFET will also be referred to as a "multi-Vt NMOS FinFET fabrication."

The second simplified case is a fabrication of an illustrative set of three p-channel metal-oxide-semiconductor (PMOS) FinFETs, with three respectively different threshold voltages, but all having the same starting structure. The example fabrication of the LVT, SVT and HVT PMOS FinFETs will also be referred to as a "multi-Vt PMOS FinFET fabrication." The examples will illustrate use of one work-function metal, for all of the multi-Vt PMOS FinFET fabrication. It will also be appreciated upon reading the description of examples of multi-Vt NMOS FinFET fabrication and examples of the multi-Vt PMOS FinFET fabrication, that these fabrication processes, one at a time or in combination, enable and provide for new methods of multi-Vt FinFET design, not available in the realm of conventional fabrication techniques.

In the case of fabricating two multi-Vt NMOS FinFETs, fabrication can start with two fins, one being a starting structure for an LVT NMOS FinFET and the other being a starting structure for an SVT/HVT NMOS FinFET. The fin for the LVT NMOS FinFET may be termed a "first fin," and the fin for the SVT/HVT FinFET may be termed a "second fin." It will be understood that the terms "first" and "second" are arbitrarily assigned, and carry meaning other than reference labels. Example operations can include forming a first gate stack on the first fin and a second gate stack on the second fin. The term "gate stack," in the context of this description of fabricating NMOS FinFETs, means a stacking of specific layers, on a surface of the fins that will be termed a "gate area," and that will function as the gate in the finished NMOS FinFETs.

In an aspect, a first gate stack is formed over a gate surface of the first fin, and a second gate stack is formed over a gate surface of the second fin. It will be understood upon reading this disclosure that operations related to the "first gate stack is formed" and operations related to the "second gate stack is formed" may have significant overlap in time. For example, many operations in forming the first gate stack and comparable operations in forming the second stack are simply repeated instances of the same operation.

In an aspect, the first gate stack, when completed, can include a first high-K dielectric layer, a first capping layer, a first work-function metal layer, a first barrier layer, and a first gate electrode metal. The first work-function metal layer can be formed of a given work-function metal, for example, titanium aluminide (TiAl). The second gate stack, when completed, can include a second high-K dielectric layer, a second capping layer, a second work-function metal layer, a second barrier layer, and a second gate electrode metal. The second work-function metal layer, in an aspect, can be formed of the same given work-function metal as the first work-function metal layer, e.g., TiAl.

Among other aspects, forming the first gate stacking and forming the gate stacking can include a partial forming of each, with a respective two instances of the same structure. The same structure may be termed a "partial gate stack." In an aspect, the partial gate stack may include a high-K dielectric layer, a capping layer, a work-function metal layer and a barrier layer. The instance of the partial gate stack that is formed at on the gate area of the first fin may be termed a "first partial gate stack." The instance of the partial gate stack that is formed at on the gate area of the second fin may be termed a "second partial gate stack." Although their respective layers are identical, for purposes of describing subsequent operations, the high-K dielectric layer in the first partial gate stack may be termed the "first high-K dielectric layer," and the high-K dielectric layer in the second partial gate stack may be termed the "second high-K dielectric layer." Similarly, the capping layer in the first partial gate stack may be termed the "first capping layer," and the capping layer in the second partial gate stack may be termed the "second capping layer."

The work-function metal layer in the first partial gate stack may be termed the "first work-function metal layer." In an aspect, as will be described in further detail at later sections, the first work-function metal layer will be the work-function metal layer in the completed gate structure on the first fin, i.e., in the gate structure of the completed LVT NMOS FinFET device. In a further aspect, the barrier layer in the first partial gate stack may be termed the "first barrier layer." As will be described in further detail, the first barrier layer can be the barrier layer in the completed gate structure on the first fin, i.e., the gate structure of the completed LVT NMOS FinFET device.

In an aspect, subsequent operations will thin the work-function metal layer in the second partial gate stack, and will replace the barrier layer in the second partial gate stack with a new barrier layer. In an aspect, as will be described in further detail, the thinning of the work-function metal layer and the new barrier layer can provide a work-function shift toward mid-gap, which in turn provides an upward tuning of Vt. For purposes of illustration, one Vt tuning range can include from approximately 50 millivolts to approximately 200 millivolts. It will be understood by persons of ordinary skill upon reading his disclosure, that the example range of approximately 50 millivolts to approximately 200 millivolts is only for purposes of illustration, and that other Vt tuning ranges, including ranges less than 50 millivolts, and/or greater than 200 millivolts, may be obtained in practices according to the disclosed embodiments.

For convenience in describing examples of the subsequent operations, the work-function metal layer in the second partial gate stack, in its initial form, can be termed "the interim work-function metal layer." Similarly, the barrier layer in the second partial gate stack, in its initial form in the second partial gate stack, can be termed the "interim barrier layer."

In an aspect, operations of thinning the interim work-function metal layer and replacing the interim barrier layer with a new barrier may include etching through the interim layer, to expose a surface of the interim work-function metal layer, followed by an oxidation of that exposed surface that can continue until an oxidation layer of a desired thickness is obtained. The oxidation layer, in an aspect, can provide the new barrier layer and, in a further aspect, the new barrier layer will provide the barrier layer in the completed gate structure of the NMOS FinFET formed with the second fin, i.e., the SVT/HVT NMOS FinFET. The new barrier layer may therefore be termed "the second barrier layer." Related to the thickness of the oxidation layer may be the thickness of the remaining (meaning not oxidized) portion of the interim work-function metal layer. In an aspect, the remaining portion of the interim work-function metal layer can provide the work-function metal layer in the completed gate structure of the NMOS FinFET formed with the second fin, i.e., the SVT/HVT NMOS FinFET. Accordingly, the new barrier layer may be termed "the second barrier layer."

In an aspect, a temporary protective layer may be disposed on the surface of the first barrier layer, prior to etching interim barrier layer in the second partial gate stack. In a relate aspect, temporary protective layer may be removed prior to depositing the gate electrode metal on the first barrier layer. As will be described in further detail at later sections, operations in removing the protective layer may include a selectivity so as to not damage the newly formed other in-process structure, e.g., the second barrier layer.

FIG. 1 shows a front cross-sectional view of one LVT NMOS FinFET 100, illustrating certain aspects of multi-Vt FinFET devices and methods according to various exemplary embodiments. FIG. 1 only shows portions of the LVT NMOS FinFET 100 that are specific to the exemplary embodiments, or that interface with such portions. For example, the LVT NMOS FinFET 100 has a fin 102, only a portion of which is visible in FIG. 1. The LVT NMOS FinFET 100 may also include a source region (not visible in FIG. 1), for example, at a position left of the sheet and a drain region (not visible in FIG. 1), for example, at a position right of the sheet.

Referring to FIG. 1, the LVT NMOS FinFET 100, a portion of an inter-level dielectric layer (ILD0) 104 is visible. Spacers, such as the spacer 106, can form opposing sides of a channel (visible in part, but not separately labeled) in which a portion of a gate stack is visible. Referring to the enlarged view "AX," the gate stack may include a high-K dielectric layer 108, a capping layer 110, a work-function metal layer 112, a barrier layer 114, and a gate electrode metal 116. The high-K dielectric layer 108 may be formed, for example, of hafnium oxide ($HfO_2$). The capping layer 110 may be formed, for example, of titanium nitride (TiN). The work-function metal layer 112 may be formed of titanium aluminide (TiAl). The barrier layer 114 may be formed, for example, of TiN. The work-function metal layer 112 has a thickness T1.

Referring to FIG. 1, it will be understood that what is visible is only the cross section of the gate stack on a projection plane normal to the gate electrode 116, and extending parallel to and within the fin 102. Persons of ordinary skill in the art can readily extrapolate the FIG. 1 gate stack to other cross-sections at varying distances into and away from the FIG. 1 sheet.

Figure 2:
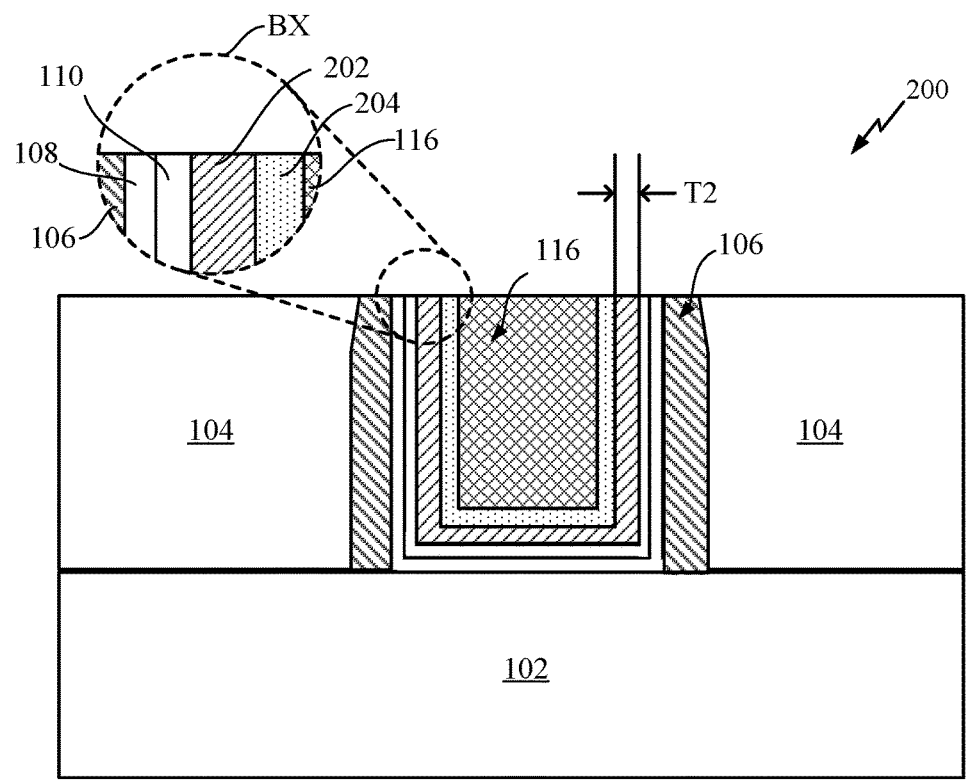
FIG. 2 shows a front cross-sectional view of one SVT/HVT NMOS illustrating aspects of multi-Vt FinFET devices and methods according to various exemplary embodiments.

FIG. 2 shows a front cross-sectional view of one SVT/HVT NMOS FinFET 200, illustrating certain aspects of multi-Vt FinFET devices and methods according to various exemplary embodiments. Much of the SVT/HVT NMOS FinFET 200 structure may be commonly configured as the SVT/HVT NMOS FinFET 100. The FIG. 2 example shows such commonly configured structure by like item number.

Comparing FIG. 2 and FIG. 1, two structural differences between the SVT/HVT NMOS FinFET 200 and the LVT NMOS FinFET 100 illustrate aspects of Vt tuning according to one or more exemplary embodiments. One of the aspects is a difference in the thickness T1 of the work-function metal layer 112 of the LVT NMOS FinFET 100 depicted in FIG. 1 relative to the thickness T2 of the work-function metal layer 202 of the SVT/HVT NMOS FinFET 200 depicted in FIG. 2. It can be seen that the thickness T2 of the work-function metal layer 202 of the SVT/HVT NMOS FinFET 200 is visibly (in the scale of the figures) less than the thickness T1 of the work-function metal layer 112 of the LVT NMOS FinFET 100. The second structural difference is the barrier layer 204 of the SVT/HVT NMOS FinFET 200, which can be an oxide of the metal forming the work-function metal layer 202, as opposed to barrier layer 114 in the LVT NMOS FinFET 100, which may be formed of TiN as mentioned above.

As described hereinabove, the thickness T2 of the work-function metal layer 202 of the SVT/HVT NMOS FinFET 200 being less than the thickness T1 of the work-function metal layer 112 of the LVT NMOS FinFET 100, in combination with the second barrier layer 204 being an oxide of work-function metal forming the work-function metal layer 202 of the SVT/HVT NMOS FinFET 200 (and of the work-function metal layer 112 of the LVT NMOS FinFET 100) can provide a work-function shift toward mid-gap, for an upward tuning of Vt. For internal referencing in describing example operation that may be applied to form the FIG. 1 LVT NMOS FinFET 100 and the FIG. 2 SVT/HVT NMOS FinFET 200, the barrier layer 204 of the SVT/HVT NMOS FinFET 200 may be termed "the second barrier," and the barrier layer 114 of the LVT NMOS FinFET 100 may be termed "the first barrier layer." Similarly, the work-function metal layer 112 of the FIG. 1 LVT NMOS FinFET 100 may be termed "the first work-function metal layer" 112, and the work-function metal layer 202 of the FIG. 2 SVT/HVT NMOS FinFET 200 may be termed "the second work-function metal layer" 202.

Methods according to one or more aspects can form a plurality of NMOS FinFETs having different threshold voltages. Operations in one example process can include providing, or forming an in-process structure comprising a first fin and a second fin, and forming a dielectric layer, in manner form a first portion of the dielectric layer on a gate area of the first fin and a second portion of the dielectric layer on a gate area of the second fin. The dielectric layer may comprise a high-K dielectric, for example, $HfO_2$. Operations in one or more example processes can further include forming a capping layer. The forming the capping layer may comprise forming a first portion of the capping layer on the first portion of the dielectric layer and a second portion of the capping layer on the second portion of the dielectric layer. Operations in one or more example processes can includes forming a work-function metal layer and, in an aspect, a first portion of the work-function metal layer may be on the first portion of the capping layer and a second portion of the work-function metal layer may be on the second portion of the capping layer. In an aspect, the work-function metal layer can comprises a given work-function metal. Operations in one or more example processes can further include forming a barrier layer, for example, forming a first portion of the barrier layer on the first portion of the work-function metal layer and a second portion of the barrier layer on the second portion of the work-function metal layer.

Continuing with description of processes and methods according to one or more aspects, operations in one or more example processes may include through the second portion of the barrier layer, and etching into or otherwise oxidizing a surface of the second portion of the work-function metal layer. The etching or otherwise oxidizing the surface of the second portion of the work-function metal layer, for example, may be associated with, or incidental to etching through the second portion of the barrier layer. In operations in one or more example processes, the etching or otherwise oxidizing the surface of the second portion of the work-function metal layer to form, or leave a remaining second portion of the work-function metal layer and, on a surface of the remaining second portion the work-function metal layer, an oxide of the work-function metal. In an aspect, the oxide of the work-function metal may, after subsequent operations, such as forming a gate electrode or gate element, perform as a new barrier layer. In a further aspect, operations in one or more example processes may include forming a first NMOS FinFET having the first fin and a first gate element on the first portion of the barrier layer, and a forming a second NMOS FinFET having the second fin and a second gate element on the new barrier layer.

In an aspect, operations in one or more example processes may form the first portion of the work-function metal layer to have a first thickness, and may form the second portion of the work-function metal layer to have a thickness equal to the first thickness. In a further aspect, operations in one or more example processes can configure the etching to form, or leave, the remaining thickness of the second portion of the work-function metal layer with a second thickness, where the second thickness may be less than the first thickness.

Continuing, in a further aspect, the first barrier and the first thickness, both separately and in combination, may establish, at least in part, a first threshold voltage for the first NMOS FinFET. In a related aspect, the new barrier layer, being an oxide of the work-function metal, as opposed to the material of the now etched-away second portion of the barrier layer, and the second thickness, both separately and in combination, may establish, at least in part, a second threshold voltage for the second NMOS FinFET. In an aspect, the second threshold voltage may be higher than the first threshold voltage.

Persons of ordinary skill in the art, upon reading this disclosure, will appreciate that disclosed aspects can enable, among other features, selective tuning of different NMOS FinFETs to different threshold voltages, while using a common structure, by simply selecting different thicknesses for various instances of the work-function metal layer, and yet initially forming all of the instances with the same work-function metal.

Figure 3:
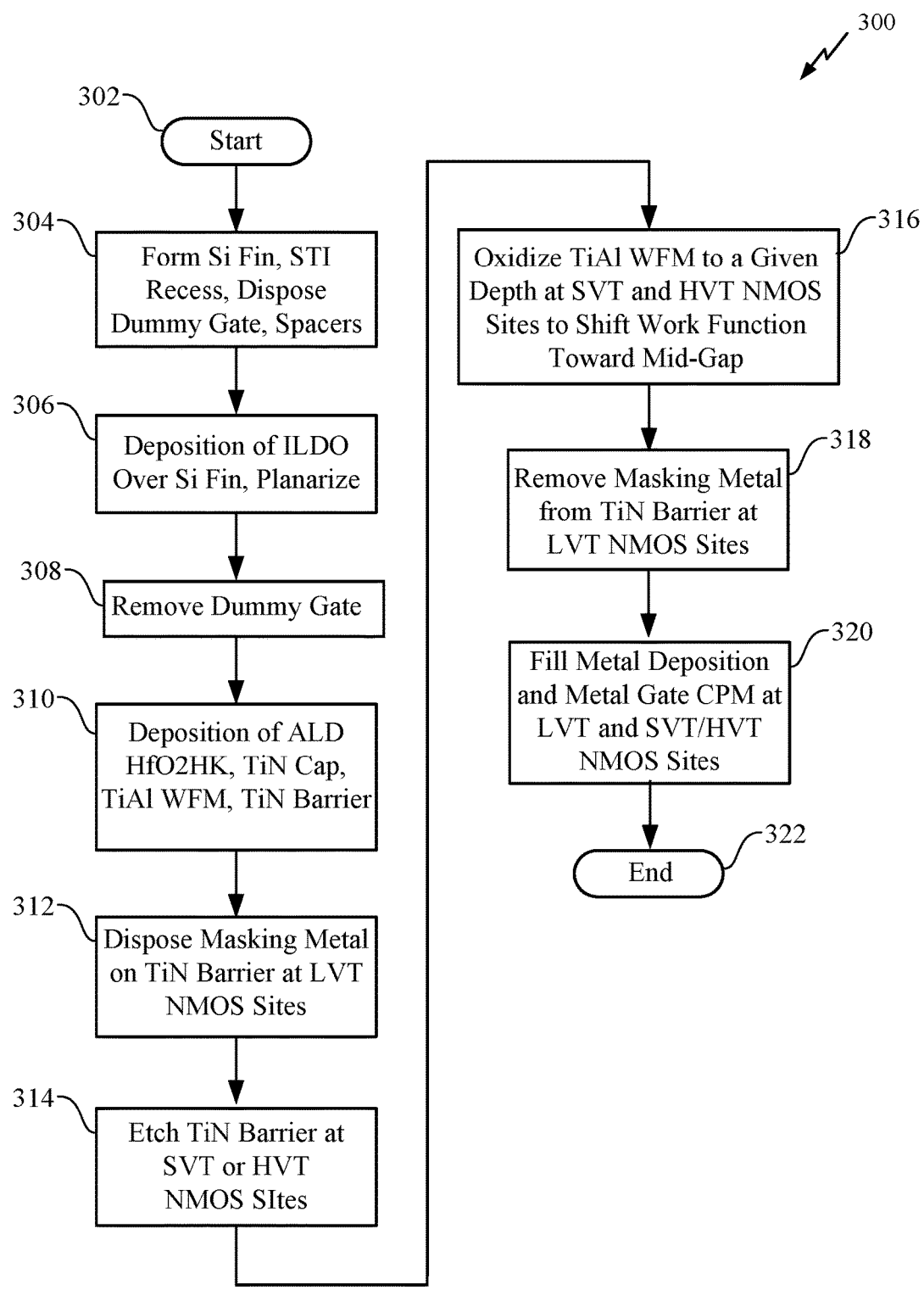
FIG. 3 shows one process flow diagram of example operations in one process of forming multi-Vt NMOS FinFETs according to various exemplary embodiments.

FIG. 3 shows one process flow diagram 300 of example operations further to processes for fabricating multi-Vt NMOS FinFETs, in devices and methods according to various exemplary embodiments. For brevity, the phrase "in the flow 300" is used, and will be understood to mean "in a process that may include operations having a logical flow as represented by the high-level flow diagram 300."

Figure 4A:
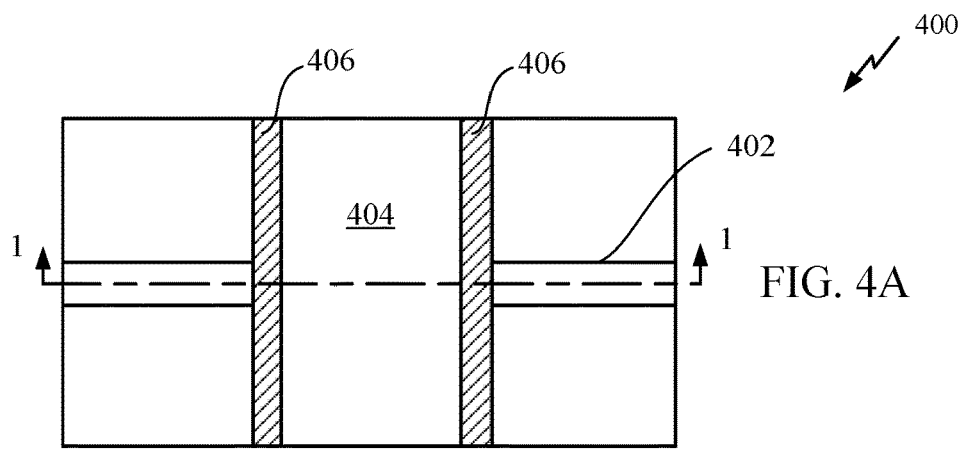
FIG. 4A shows a top projection view of one in-process structure, having a fin, a dummy gate and spacers, for illustrating example operations in processes for multi-Vt NMOS FinFETs according to various exemplary embodiments.
Figure 4B:
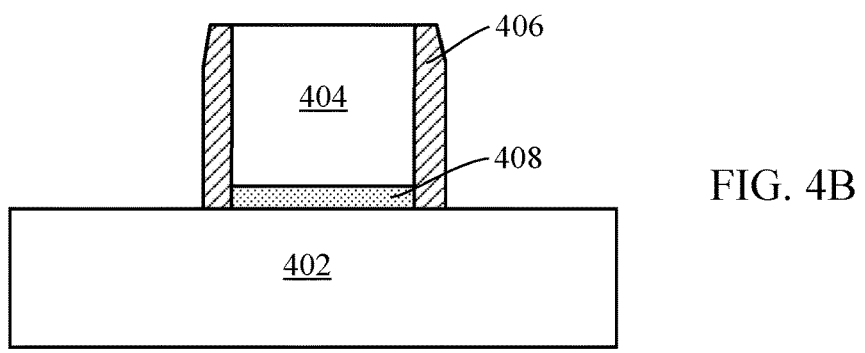
FIG. 4B is a cross-sectional view, on the FIG. 4A cut plane 1-1.

Referring to FIG. 3, operations in the flow 300 can start at an arbitrary 302. Operations in the flow 300 may include, at 304, providing or forming starting structures for forming an LVT NMOS FinFET and an SVT/HVT NMOS FinFET in accordance with one or more exemplary embodiments. The starting structured formed or provided at 304 may include a first fin and a second fin and, for each, a surrounding shallow trench isolation (STI), and dummy gate and spacers. The first fin, and its surrounding STI, dummy gate and spacers, may be for forming an LVT NMOS FinFET. The second fin, and its surrounding STI, dummy gate and spacers, may be for forming an LVT NMOS FinFET. One example is illustrated in FIGS. 4A and 4B, in which FIG. 4A shows a top projection view of one in-process structure 400, having a fin 402, a dummy gate 404 and spacers 406. FIG. 4B is a cross-sectional view, on the FIG. 4A cut plane 1-1, showing a dummy oxide layer between the fin 402 and the poly of the dummy gate 404. It will be understood that an example fabrication of multi-Vt NMOS FinFETs, having one LVT NMOS FinFET and one SVT/HVT NMOS FinFET, will include forming two of the FIG. 4A-4B in-process structures 400.

Figure 5A:
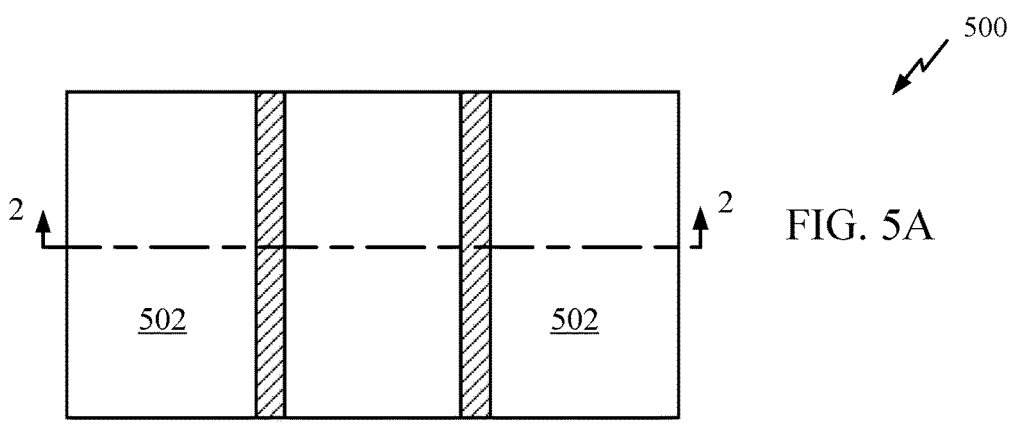
FIG. 5A shows a top projection view of one in-process structure, illustrating example operations of deposition of inter-layer dielectric (ILOD) and planarization, on the FIG. 4A-4B in-process structure, in processes for multi-Vt NMOS FinFETs according to various exemplary embodiments.
Figure 5B:
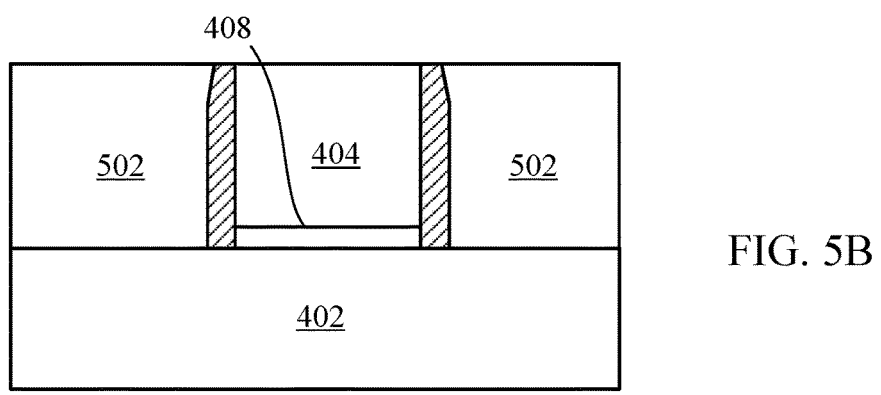
FIG. 5B is a cross-sectional view, on the FIG. 5A cut plane 2-2.

Referring to FIG. 3, at 306, operations may include deposition of an inter-level dielectric layer (ILD0) over the first fin and the second fin, followed by planarizing the upper surface. FIG. 5A shows a top projection view of one in-process structure 500 that may result, by deposition of ILD0 502, followed by planarization. FIG. 5B is a cross-sectional view, on the FIG. 5A cut plane 2-2, showing the planarization. It will be understood that an example fabrication of multi-Vt NMOS FinFETs, having one LVT NMOS FinFET and one SVT/HVT NMOS FinFET, will include forming two of the FIG. 5A-5B in-process structures 500.

Figure 6A:
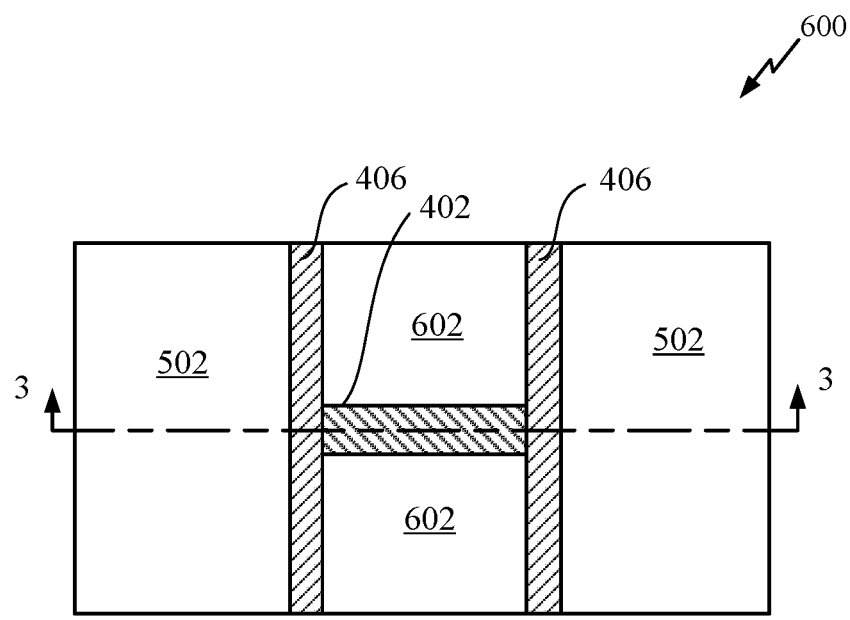
FIG. 6A shows a top projection view of one in-process structure, illustrating example removal of dummy gate structure from the in-process structure shown by FIGS. 5A-5B, in processes for multi-Vt NMOS FinFETs according to various exemplary embodiments.
Figure 6B:
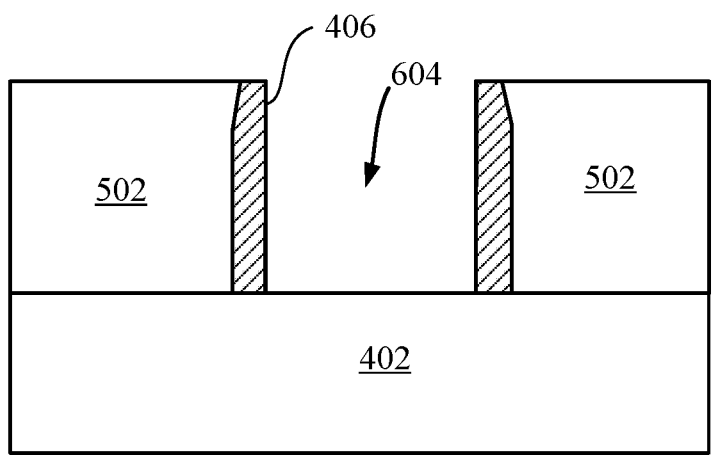
FIG. 6B is a cross-sectional view, on the FIG. 6A cut plane 3-3.

Referring to FIG. 3, at 308, operations in the flow 300 may include removing a dummy gate from the in-process structures formed by operations at 306. One example is illustrated at FIG. 6A, which shows a top projection view of one in-process structure 600, illustrating example operations of removing a dummy gate 404 from the in-process structure shown by FIGS. 4A-5B. FIG. 6B is a cross-sectional view, on the FIG. 6A cut plane 3-3. Referring to FIG. 6A, operations removing the dummy gate 404 can expose STI surfaces 602 and form a channel 604 between the remaining spacers 406. It will be understood that an example fabrication of multi-Vt NMOS FinFETs, having one LVT NMOS FinFET and one SVT/HVT NMOS FinFET, will include forming two of the FIG. 6A-6B in-process structures 600.

Referring to FIG. 3, at 310, operations in the flow 300 can include, after the removal of the dummy gate at 308, a deposition, on each of the two fins (now exposed by removing their dummy gates, of a partial gate stack. The deposition of the partial gate stack at 310 may include deposition of a high-K dielectric layer, a capping layer, a work-function metal layer, and a barrier layer. The high-K dielectric layer may, for example, comprise $HfO_2HK$. The capping layer may, for example, comprise TiN. Examples of the work-function metal layer and barrier layer may comprise TiAl and TiN, respectively.

Figure 7A:
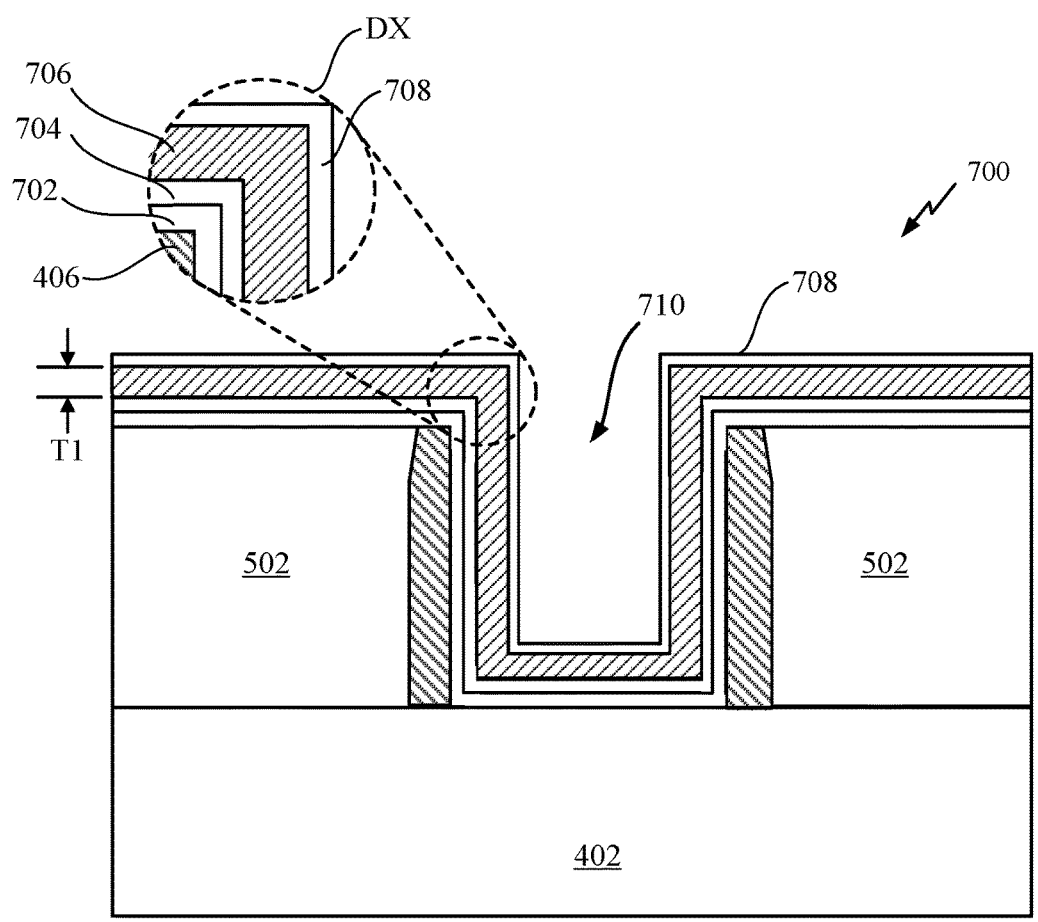
FIG. 7A is a cross-sectional view of an in process-structure, illustrating example operations of deposition of a partial gate stack, in processes for fabricating multi-Vt NMOS FinFETs according to various exemplary embodiments.
Figure 7B:
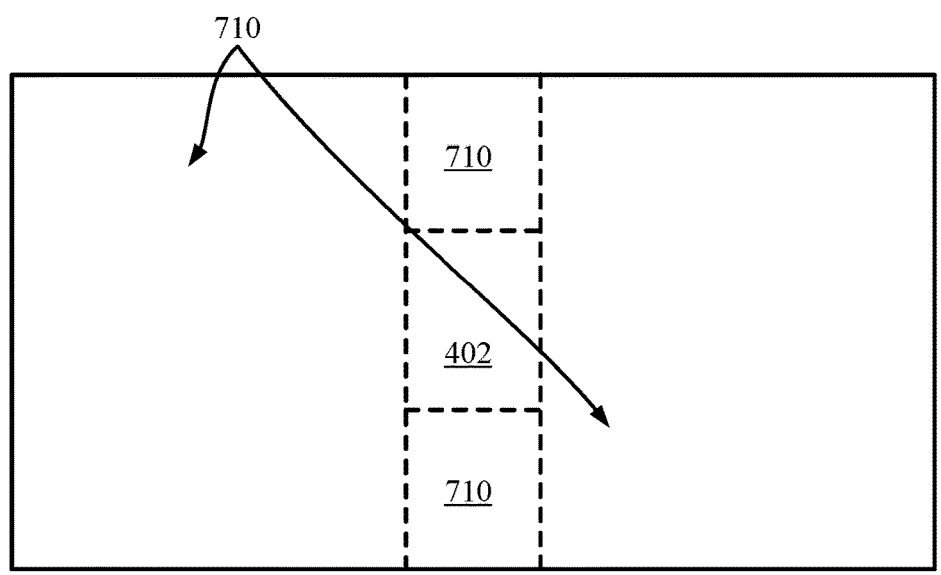
FIG. 7B is a top projection view of the in-process structure shown in cross-section in FIG. 7A.

FIGS. 7A-7B reflect example operations that may be performed at 310 in the deposition of the partial gate stacks. Referring to FIG. 7A, as can be seen in the enlarged view DX, operations may form, in a stacking order starting on the channel surfaces (facing walls of the spacers 406 and top of the fin 402) a high-K dielectric layer 702, a capping layer 704, a work-function metal layer 706, and a barrier layer 708. A channel 710 remains for subsequent fill with a gate electrode metal (not shown in FIGS. 7A-7B). The high-K dielectric layer 702 may, for example, comprise $HfO_2$. In one example implementation, the capping layer 704 may comprise TiN, the work-function metal layer 706 may comprise TiAl, and the barrier layer 708 may comprise TiN. The work-function metal layer 706 can have the thickness "T1," described in reference to FIG. 1. FIG. 7B is a top projection view of the in-process structure shown in cross-section in FIG. 7A. FIG. 7B includes hidden lines (dotted) that indicate a profile of the gate cavity 710 and the fin 402. It will be understood that an example fabrication of multi-Vt NMOS FinFETs, having one LVT NMOS FinFET and one SVT/HVT NMOS FinFET, will include forming two of the FIG. 7A-7B in-process structures 700.

Figure 8:
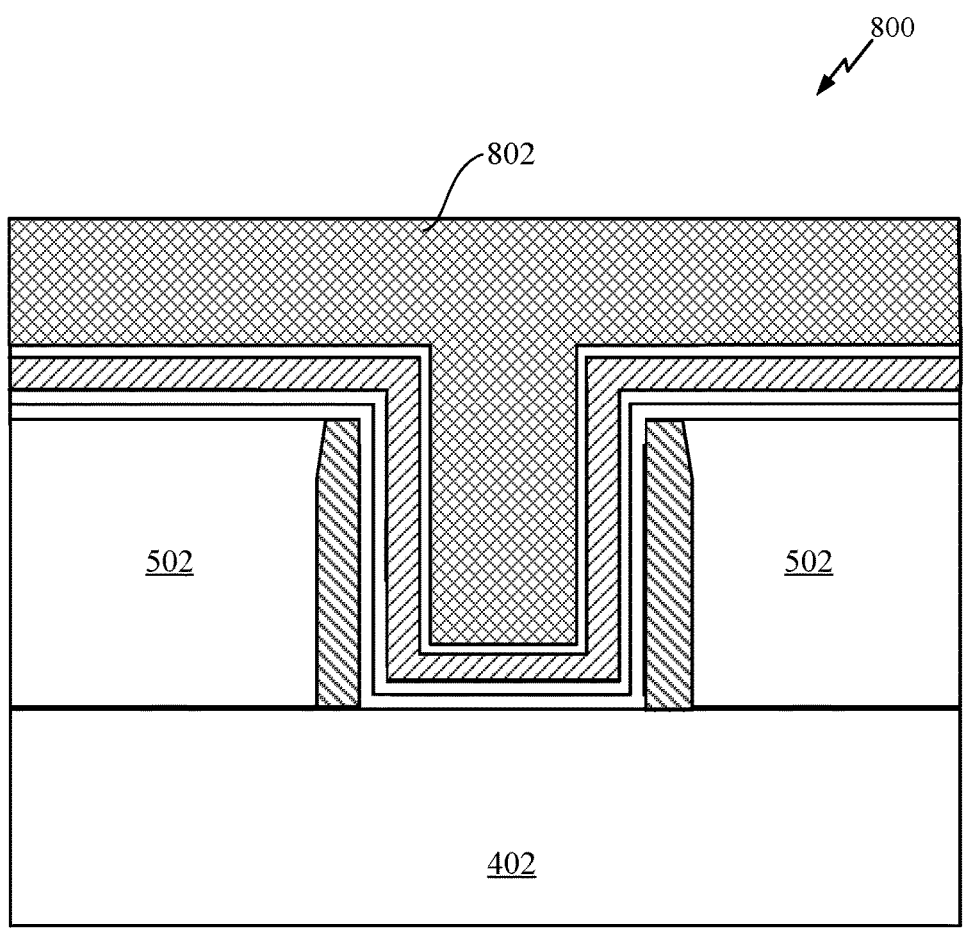
FIG. 8 is a cross-sectional view of an in process-structure, illustrating example operations of deposition of an etching protection mask on a work-function metal layer of an LVT NMOS FinFET in processes for multi-Vt NMOS FinFETs according to various exemplary embodiments.

Referring to FIG. 3, operations in the flow 300 can include, at 312, depositing a masking metal on the TiN barrier of the partial channel stack formed, at 310, on the LVT NMOS FinFET. The masking metal can be deposited at 312 prior to performing an etching on the barrier layer (FIG. 7A, item 708) of the in-process structure for forming the LVT NMOS FinFET. FIG. 8 shows, by the in-process structure 800, an example masking metal 802 that may be applied by operations at 312. The masking metal 802 may be applied, for example, using spin-on deposition ("SOD").

Referring to FIG. 3, operations in the flow 300 may include, at 314, etching the TiN barrier at the SVT/HVT NMOS FinFET sites. In an aspect, the masking metal deposited at 312 may prevent this etching from damaging the barrier layers formed on the partial gate stacks at the LVT NMOS FinFET sites. Continuing to refer to FIG. 3, after etching away the barrier layer, by operations at 314, of barrier layers in the partial gate stacks at the SVT/HVT FinFET sites, operations in the flow 300 can include oxidizing the exposed surface of the barrier layer at 316.

Figure 9A:
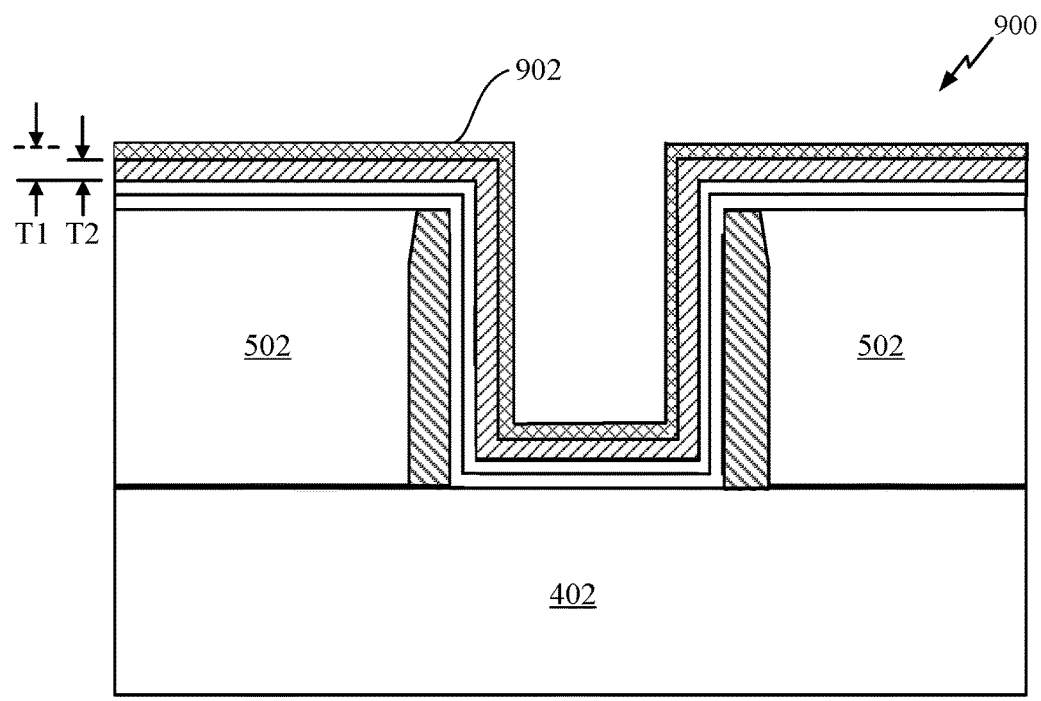
FIG. 9A is a cross-sectional view of an in process-structure, illustrating example operations of etching through the interim barrier layer and partially oxidizing a work-function metal layer, in a partial gate stack formed on an SVT/HVT NMOS FinFET, in processes for multi-Vt NMOS FinFETs according to various exemplary embodiments.

FIG. 9A reflects, by in-process structure 900, example operations of etching, at 314, of the barrier layer in the partial gate stacks at the SVT/HVT FinFET sites, and oxidation, at 316, of the exposed work-function metal layer. Referring to FIG. 9A, it is seen that the barrier layer 708 is gone, and a new barrier layer 902 is in its place. The new barrier layer 902 may be alternatively referred to as a "second barrier layer" 902. The new barrier layer 902 may be an oxide of the work-function metal. For example, if the work-function metal is TiAl, the new barrier layer may be formed of titanium aluminum oxide (TiAlO$_x$). It will be understood that "in its place" encompasses "approximately in its place," because the new barrier layer 902 may be thicker (or thinner) than the etched-away barrier layer 708. Also as shown by FIG. 9A, the remaining portion of the work-function metal layer 706 has the thickness "T2," and "T2 is less than T1. Specific values of the difference between T2 and T1 may be application specific, for example, based on the amount of Vt tuning desired. Persons of ordinary skill in the art, upon reading the present disclosure in its entirety, can readily determine the target difference between T2 and T1 using, for example, various commercially available simulation tools, without undue experimentation.

Figure 9B:
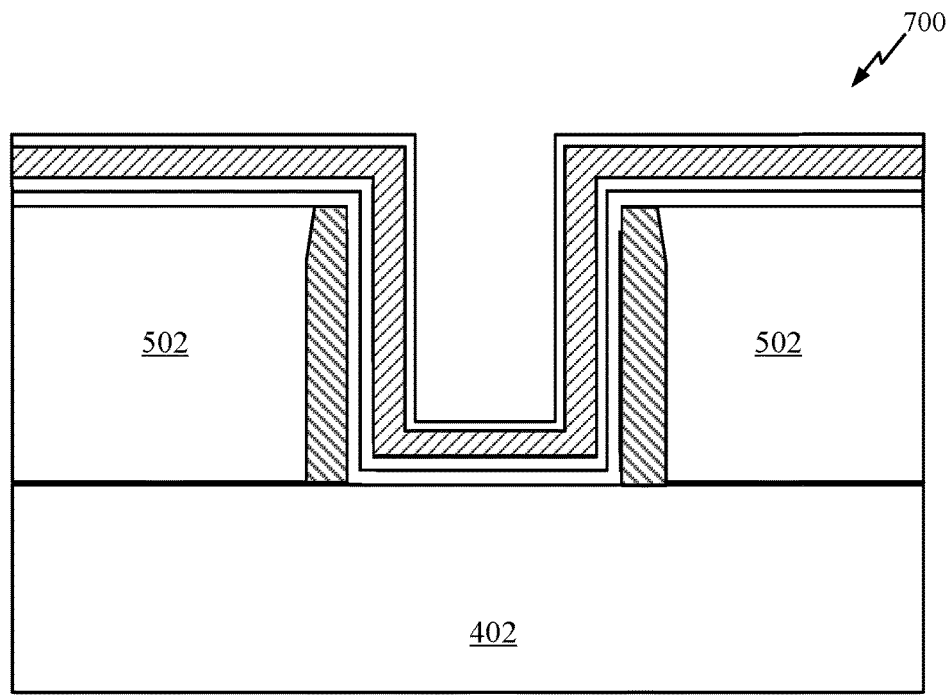
FIG. 9B is a cross-sectional view of an in process-structure, illustrating removal of a protective mask, and retained thickness of a work-function metal layer in an in-process LVT NMOS FinFET, in processes for multi-Vt NMOS FinFETs according to various exemplary embodiments.

Referring to FIG. 3, after operations of etching at 314 and oxidizing at 316 at the SVT/HVT NMOS FinFET sites, operations in the flow 300 can include, at 318, removing the metal mask from the barrier layer at the one or more LVT NMOS FinFETs fabricated alongside the SVT/HVT NMOS FinFETs. FIG. 9B reflects such operations, by showing a duplicate of the in-process structure 700 described in reference to FIGS. 7A-7B.

Continuing to refer to FIG. 3, after forming the FIG. 9A in-process structure 900 at the SVT/HVT NMOS FinFET sites, maintaining the FIGS. 7A, 7B and 9B in process-structure 700 at the LVT NMOS FinFET site, operations in the flow 300 can include, at 320, deposition of fill metal, and chemical mechanical polishing (CPM) to complete the metal gate in the remaining channel and, at 322, to end the flow 300.

Figure 10A:
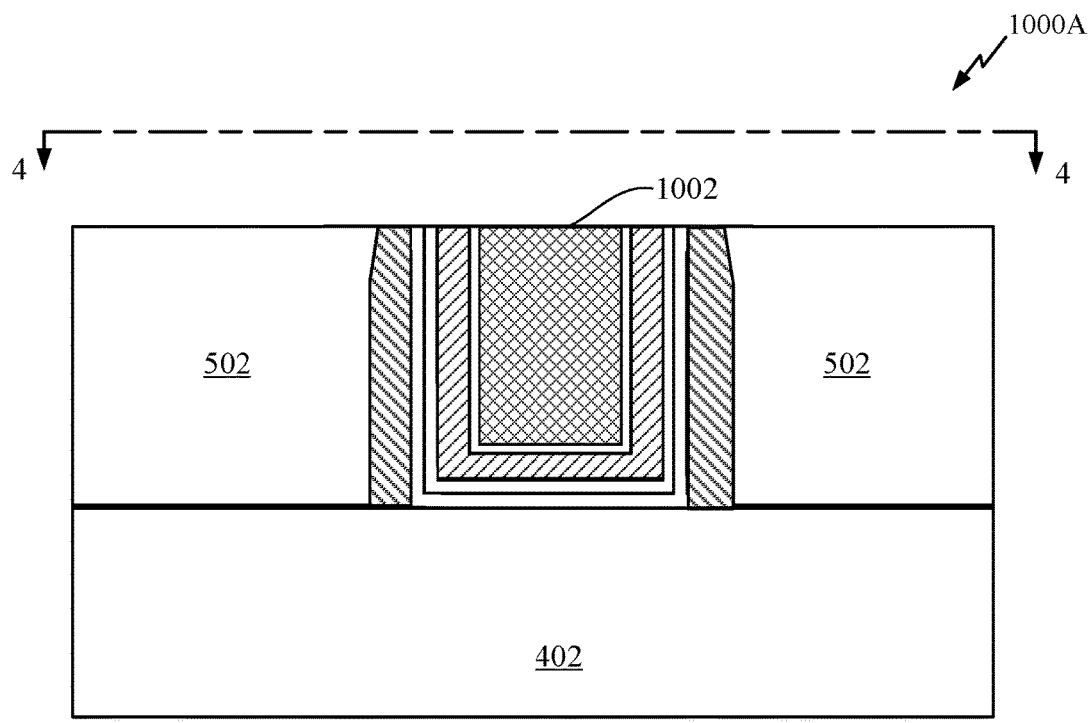
FIG. 10A is a cross-sectional view of a completed LVT NMOS FinFET, after a planarization of the FIG. 9B in-process LVT NMOS FinFET structure, in a process for multi-Vt NMOS FinFETs according to various exemplary embodiments.
Figure 10B:
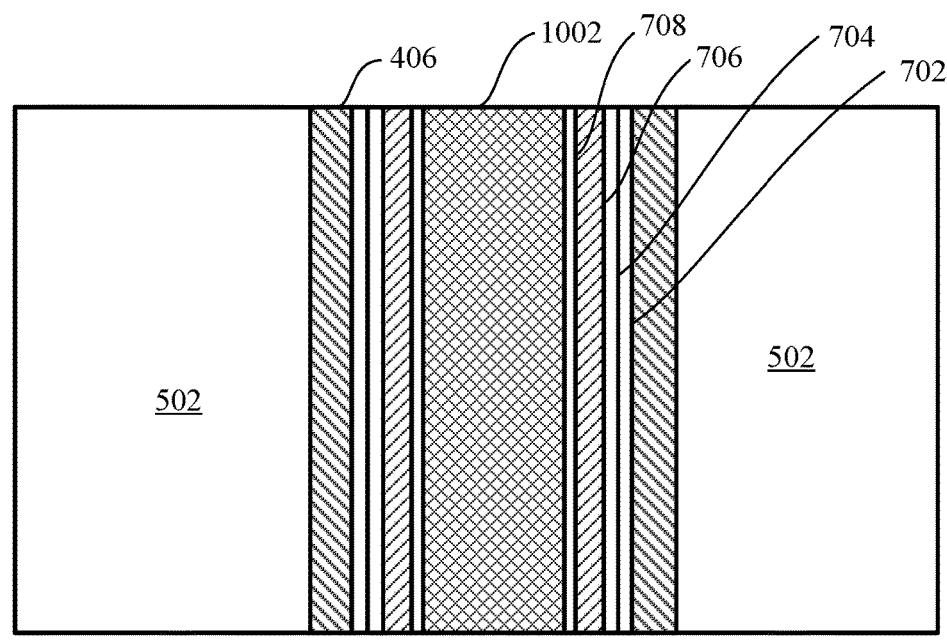
FIG. 10B is a top projection view, on the projection plane 4-4, of the LVT NMOS FinFET shown in cross-section at FIG. 10A.

FIG. 10A is cross-sectional view and FIG. 10B is a top projection view, on projection 4-4, of an in-process structure 1000A that reflects operations at 320 on the LVT NMOS FinFET in-process structure 700, as shown by the planar upper surface SV, and the gate fill metal 1002.

Figure 10C:
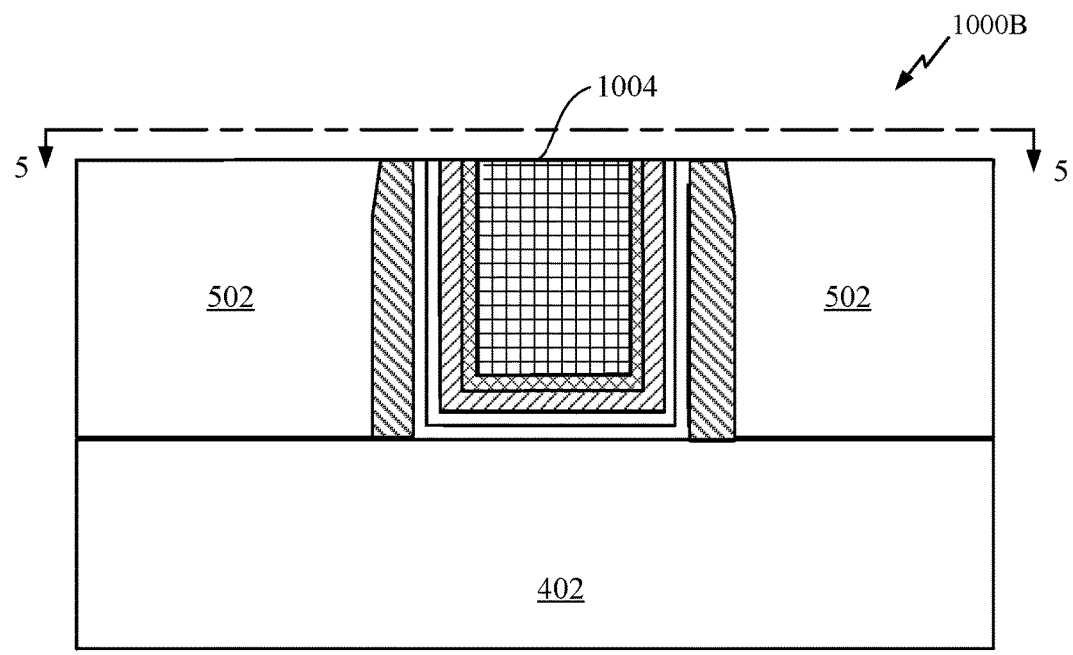
FIG. 10C is a cross-sectional view of a completed SVT/HVT NMOS after a planarization of the FIG. 9A in-process SVT/HVT NMOS FinFET structure, in processes for fabricating multi-Vt NMOS FinFETs according to various exemplary embodiments.
Figure 10D:
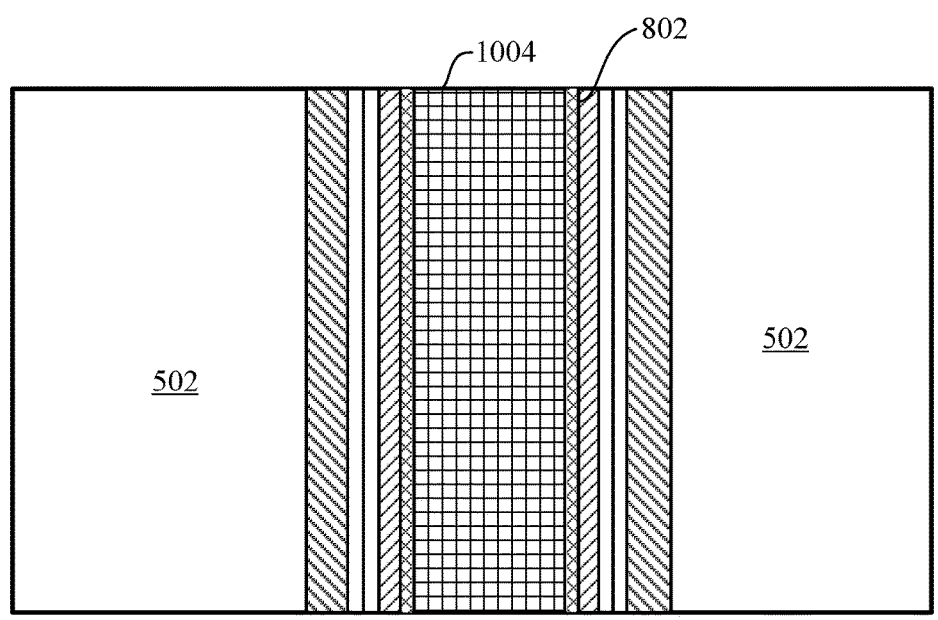
FIG. 10D is a top projection view, on the projection plane 5-5, of the in-process structure shown in cross-section at FIG. 10C.

FIG. 10C is cross-sectional view and FIG. 10D is a top projection view, on projection 5-5, of an in-process structure 1000B that reflects operations at 320 on the SVT/HVT NMOS FinFET in-process structure 900, as shown by the planar upper surface TV, and the gate fill metal 1004.

Aspects and example operations and structures for providing and fabricating multi-Vt PMOS FinFETs will now be described. Described examples include design and fabrication of an illustrative set of three PMOS FinFETs, providing three respectively different threshold voltages. Design and fabrication of the set of three can provide, as will be described in further detail in later sections, an LVT, an SVT and an HVT PMOS FinFET. In an aspect, all three can start with the starting structure. In a further aspect, all three, i.e., the LVT, the SVT and the HVT PMOS FinFET, may use the same work-function metal.

In an aspect, Vt tuning, for designing and fabricating multi-Vt PMOS FinFETs may be provided by using a silicon (Si) fin as a common starting element, and establishing various, selectable percentages or concentrations of germanium (Ge). Further to this aspect, a light Ge concentration may provide an HVT PMOS FinFET, and a high Ge concentration may provide an LVT PMOS FinFET. In a further aspect, an intermediate concentration of Ge may be implanted to provide an SVT PMOS FinFET.

In an aspect, the LVT, the SVT and the HVT PMOS FinFETs may be fabricated with all structural parameters identical, with the exception of the Ge concentration implanted in their respective Si fins.

Operations in one example process can include forming a plurality of fins, wherein the plurality of fins may include a first Si fin and a second Si fin. Operations in one example process can further include establishing in the first Si fin a first concentration of Ge, to form a first silicon-germanium (SiGe) fin having the first concentration of Ge, and establishing in the second Si fin a second concentration of Ge, to form a second SiGe fin having the first concentration of Ge. In an aspect, the second concentration of Ge may be higher than the first concentration of Ge. Operations in one example process can include forming a first PMOS FinFET and a second PMOS FinFET, wherein forming the first PMOS FinFET can include forming a first gate stack on a gate area of the first SiGe fin and forming the second PMOS FinFET comprises forming a second gate stack on a gate area of the second SiGe fin. In an aspect, the first gate stack can have a first work-function metal layer, and the second gate stack can have a second work-function metal layer. In a further aspect, the first work-function metal layer and the second work-function metal layer may have a mutually identical thickness and comprise a mutually identical work-function metal. For example, operations may form the first work-function metal layer and the second work-function metal layer concurrently, as separate instances of an identical structure, e.g., in a single metallization step. In an aspect, a difference of the first concentration of Ge from the second concentration of Ge, establishes, at least in part, respectively different threshold voltages Vt. In an example where the second Ge concentration is higher than the first Ge concentration, the threshold voltage of the second PMOS FinFET will be lower than the threshold voltage of the first PMOS FinFET.

Figure 11A:
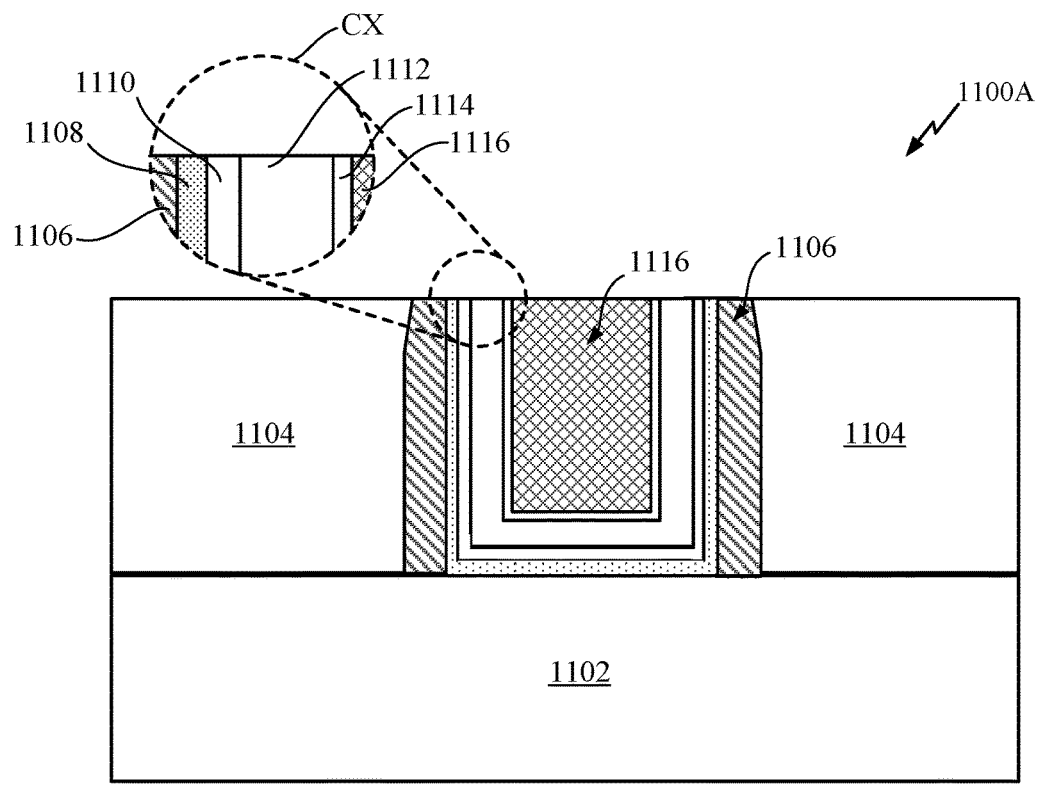
FIG. 11A shows a front cross-sectional view of one LVT PMOS illustrating aspects of multi-Vt FinFET devices and methods according to various exemplary embodiments.
Figure 11B:
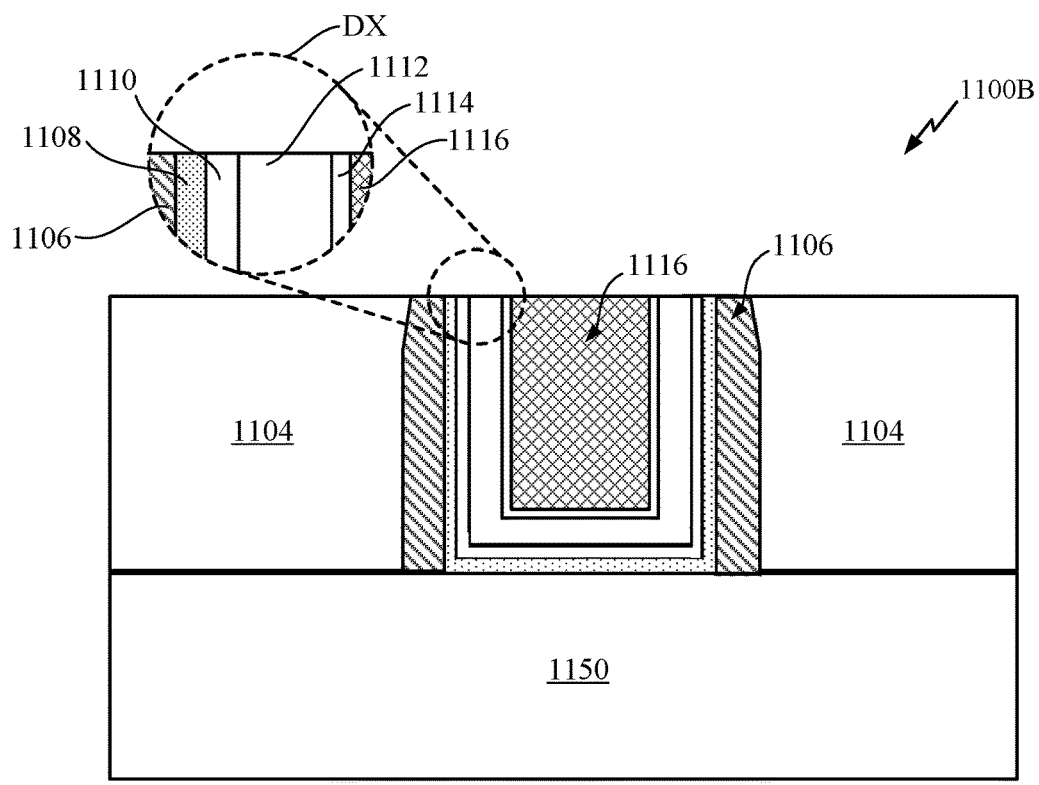
FIG. 11B shows a front cross-sectional view of one HVT NMOS illustrating aspects of multi-Vt FinFET devices and methods according to various exemplary embodiments.

FIG. 11A shows a front cross-sectional view of one LVT PMOS FinFET 1100A, and FIG. 11B shows a front cross-sectional view of one HVT NMOS FinFET 1100B, and together these illustrate aspects of multi-Vt FinFET devices and methods according to various exemplary embodiments.

Referring to FIG. 11A, the HVT PMOS FinFET 1100A includes a fin 1102, ILD0 1104, and spacers 1106, and a gate stack (shown by enlarged view "CX") that comprises a high-K dielectric layer 1108, a capping layer 1110, a work-function metal layer 1112, a barrier layer 1114, and a gate metal 1116. In an aspect, the fin 1102 may be a SiGe fin, having a particular concentration of Ge. The particular concentration of Ge may be, further to this aspect, in accordance with the Vt, namely, the higher the Ge concentration, the higher the Vt value. The high-K dielectric layer 1108 may comprise, for example, HfO$_2$; the capping layer 1110 may comprise, for example, TiN; the work-function metal layer 1112 may comprise, for example, TiN; the barrier layer 1114 may comprise, for example, TiN; and the gate metal 1116 may comprise, for example, tungsten (W).

Referring to FIG. 11B, the LVT PMOS FinFET 1100B can be identical in all respects to the HVT PMOS FinFET 1100A, except for its fin 1150 being, for example, Si, as opposed to the SiGe material of the fin 1102.

Figure 12:
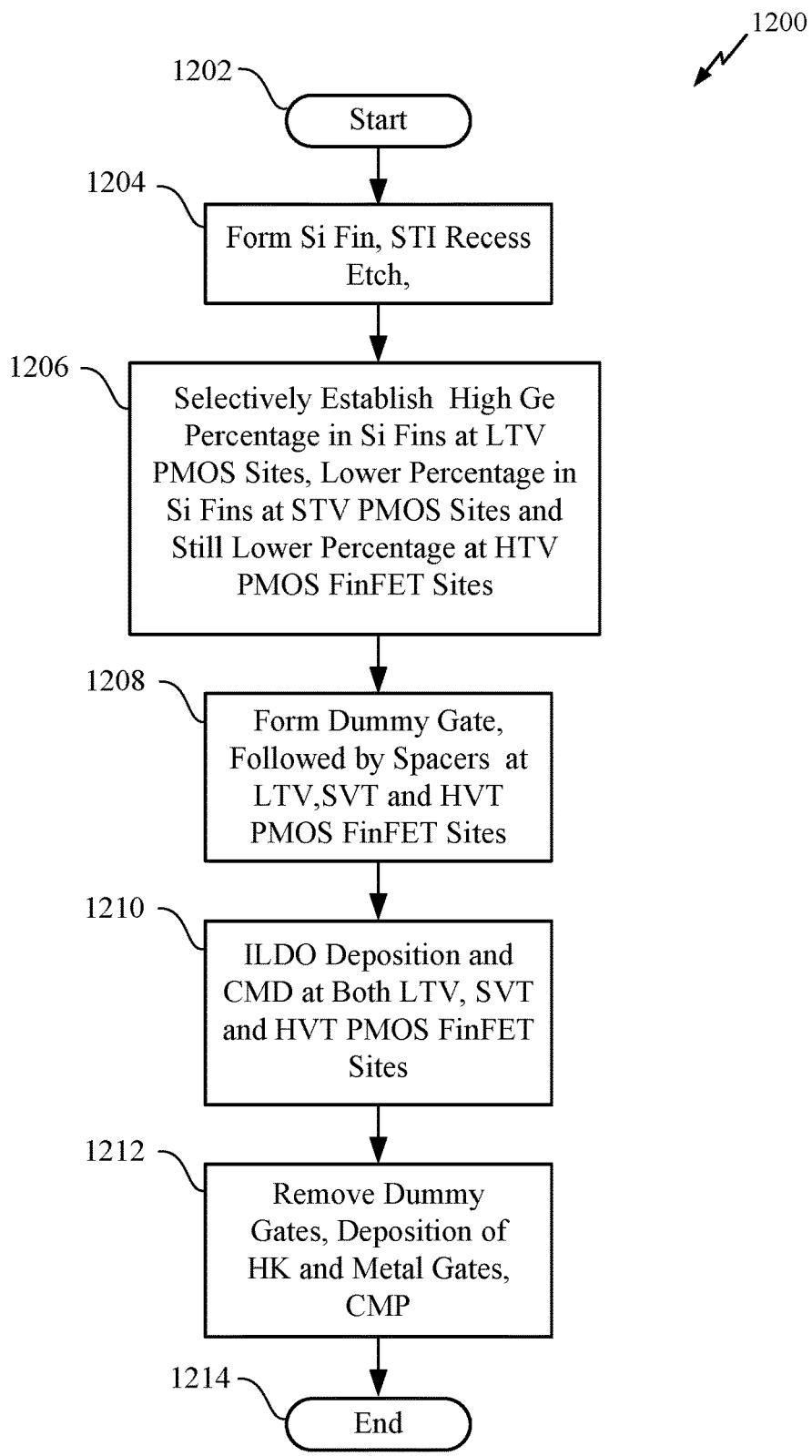
FIG. 12 shows one process flow diagram of example operations in processes for fabricating multi-Vt PMOS FinFETs, in devices and methods according to various exemplary embodiments.

FIG. 12 shows one process flow diagram 1200 of example operations in processes for design and fabricating multi-Vt PMOS FinFETs according to various exemplary embodiments. For brevity, the phrase "in the flow 1200" is used, and will be understood to mean "in a process that may include operations having a logical flow as represented by the high-level flow diagram 1200."

Figure 13A:
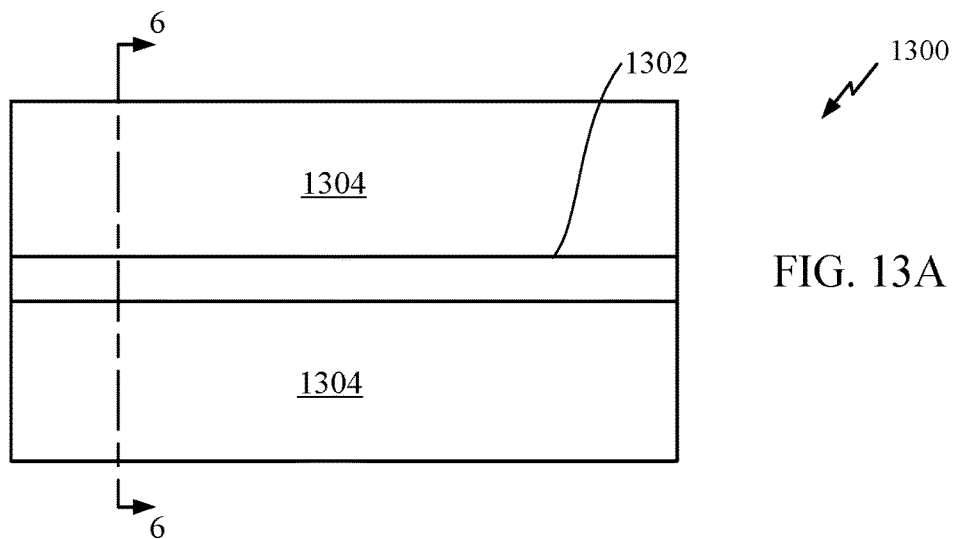
FIG. 13A shows a top projection view of one in-process structure for describing example operations in forming any of an LVT, SVT or HVT PMOS FinFET, in processes for fabricating multi-Vt NMOS FinFETs according to various exemplary embodiments.
Figure 13B:
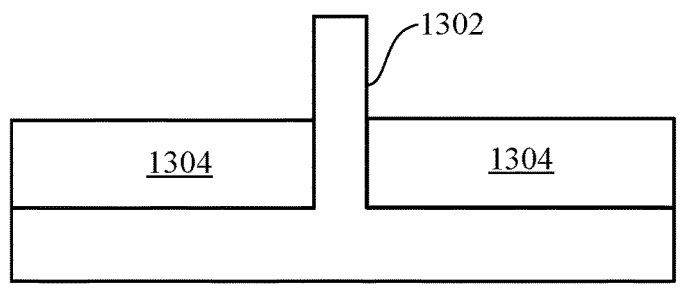
FIG. 13B is a cross-sectional view, on the FIG. 13A cut plane 6-6.

Referring to FIG. 12, operations in the flow 1200 can start at an arbitrary 1202. Operations in the flow 1200 may include, at 1204, providing or forming starting structures comprising a Si fin and STI. FIG. 13A shows a top projection view of one in-process structure 1300 that may be a starting structure used in FIG. 12, at 1204. As will be appreciated upon reading this entire disclosure, the starting structure 1300 may be used for forming any of an LVT, SVT or HVT PMOS FinFET according to various exemplary embodiments. Referring to FIG. 13A, the in-process structure 1300 includes a fin 1302 and STI 1304. In an aspect, the fin 1302 may be formed of silicon. Example operations assuming the fin 1302 is formed of silicon will refer to the fin 1302 as the "Si fin" 1302. FIG. 13B is a cross-sectional view of the in-process structure 1300, on the FIG. 13A cut plane 6-6.

Referring again to FIG. 12, operations in the flow 1200, after forming or being provided with the silicon fin starting structure at 1204, can, at 1206, selectively establish high Ge percentage in Si fins of starting structures at LTV PMOS sites, and a lower Ge percentage in Si fins at both STV PMOS FinFET sites, and a still lower Ge percentage in Si fins at HTV PMOS FinFET sites. The Ge percentages may be established, for example, by operations of Ge condensation, or Ge implant, or combinations of both. It will be understood that the described example of three ranges is only for illustrative purposes, and is not intended as a limitation on the scope of any embodiment. For example, four ranges may be selected. In another example, a fewer number of ranges may be used, for example, two. Assuming three levels of Ge concentration, in an aspect, the lowest of the three percentages can include zero, i.e., maintaining the fins as Si fins.

Accordingly, in one example of operations at 1206 of the flow 1200, three Si fin starting-structures are formed or provided at 1204. Operations at 1206, applied to the three starting structure example, can form or establish a high Ge percentage in the Si fin of the starting structure for the LTV PMOS FinFET, a lower Ge percentage in the Si fin of the starting structure for the STV PMOS FinFET, and the lower Ge percentage, which may include zero percent, in the Si fin of the starting structure for the HVT PMOS FinFET. For purposes of description, the lowest of the three Ge percentages, which is for HVT PMOS FinFETs, can include zero, will be referred to as the "first Ge concentration." The next higher (or next lower, if starting at the highest) of the three Ge percentages, which is for SVT PMOS FinFETs, will be referred to as the "second Ge concentration." The highest of the three Ge percentages, which is for LVT PMOS FinFETs, will be referred to as the "third Ge concentration."

Figure 14A:
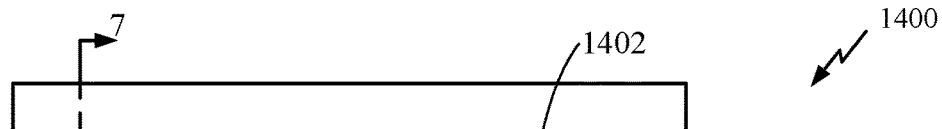
FIG. 14A shows a top projection view of one in-process structure, for subsequent processing into any of an SVT or LVT PMOS FinFET, illustrating Ge tuning of Vt in processes for fabricating multi-Vt PMOS FinFETs according to various exemplary embodiments.
Figure 14B:
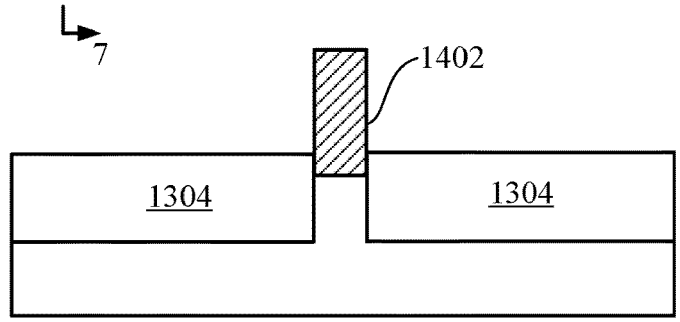
FIG. 14B is a cross-sectional view, on the FIG. 14A cut plane 7-7.

FIG. 14A shows a top projection view of one in-process structure 1400, having a SiGe fin 1402 in which the second level of Ge concentration has been established. As described, the Ge percentages may be formed or established, for example, by operations of Ge condensation, or Ge implant, or combinations of both, on the FIG. 13A-13B starting structure 1300. FIG. 14B is a cross-sectional view of the in-process structure 1400, on the FIG. 14A cut plane 7-7.

FIG. 15A shows a top projection view of one in-process structure 1500, having a SiGe fin 1502, in which the third level of Ge concentration has been established. The in-process structure 1500 is therefore to be formed into an LVT PMOS FinFET according to various exemplary embodiments. FIG. 15B is a cross-sectional view of the in-process structure 1500, on the FIG. 15A cut plane 8-8.

Referring to FIG. 12, operations in the flow 1200, after forming or establishing at 1206 appropriate levels of Ge concentrations in the fins can, at 1208, form dummy gates and spacers over all of the PMOS FinFETs processed at 1206.

FIG. 16A shows a top projection view of one in-process structure 1600, for forming into an HVT PMOS FinFET, illustrating forming a dummy gate 1602 and spacers 1604 on the FIG. 13A-13B in-process structure. FIG. 16B is a cross-sectional view of the in-process structure 1600, over the FIG. 16A cut plane 9-9.

Figure 17A:
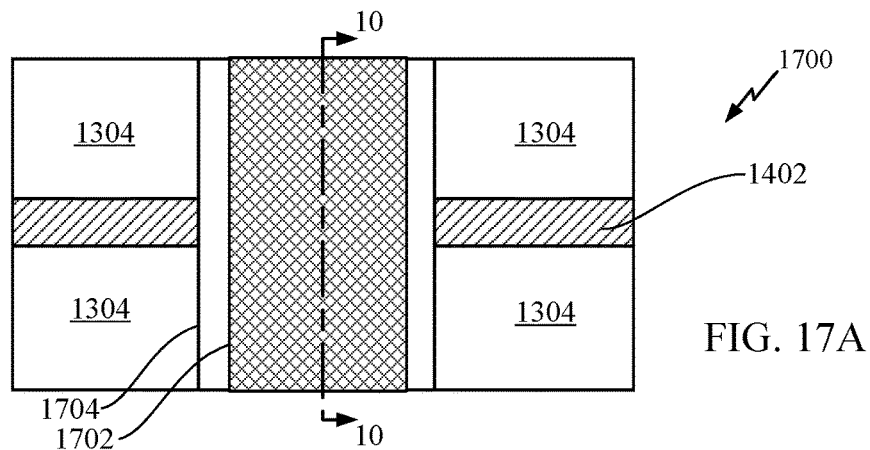
FIG. 17A shows a top projection view of one in-process structure for an SVT PMOS FinFET according to various exemplary embodiments, illustrating a dummy gate and spacers on the FIG. 14A-14B in-process structure.
Figure 17B:
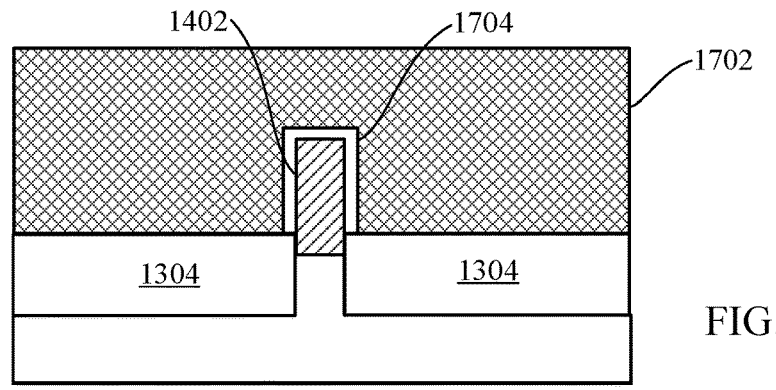
FIG. 17B is a cross-sectional view, on the FIG. 17A cut plane 10-10.

FIG. 17A shows a top projection view of one in-process structure 1700, for forming into an SVT PMOS FinFET, illustrating forming a dummy gate 1702 and spacers 1704 on the FIG. 14A-14B in-process structure. FIG. 17B is a cross-sectional view, on the FIG. 17A cut plane 10-10.

Figure 18A:
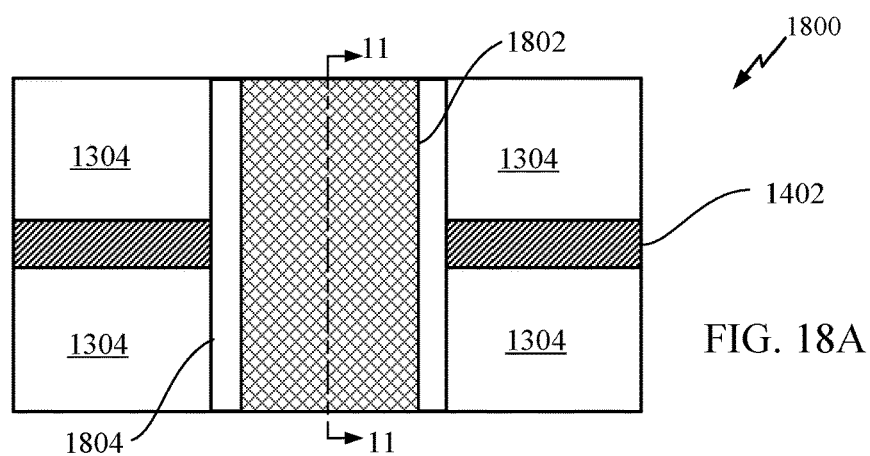
FIG. 18A shows a top projection view of one in-process structure for an LVT PMOS FinFET according to various exemplary embodiments, illustrating a dummy gate and spacers on the FIG. 15A-15B in-process structure.
Figure 18B:
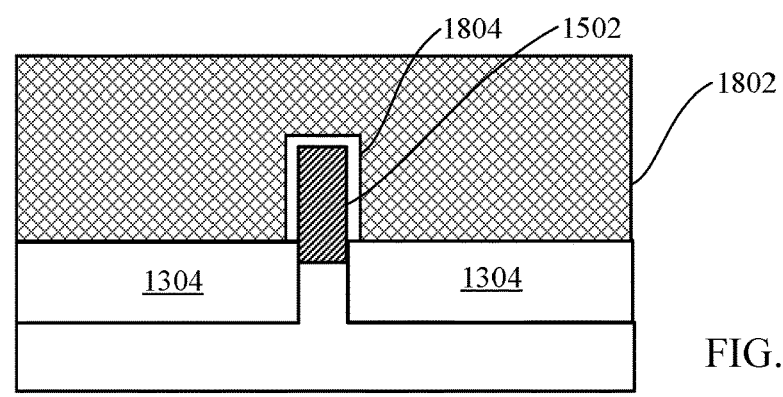
FIG. 18B is a cross-sectional view, on the FIG. 18A cut plane 11-11.

FIG. 18A shows a top projection view of one in-process structure 1800, for forming into an LVT PMOS FinFET, illustrating forming a dummy gate 1802 and spacers 1804 on the FIG. 15A-15B in-process structure 1500. FIG. 18B is a cross-sectional view, on the FIG. 18A cut plane 11-11.

Figure 19A:
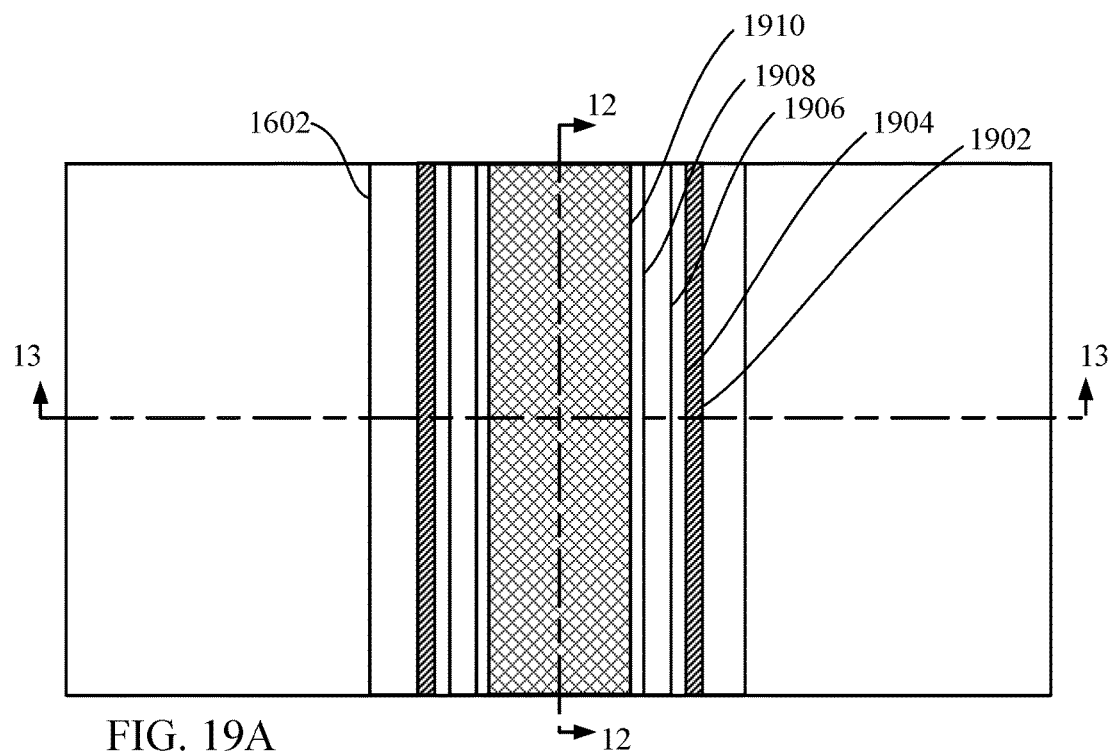
FIG. 19A shows a top projection view of any of various different Vt PMOS FinFETs according one more exemplary embodiments after removal of dummy gate an formation of a channel stack.
Figure 19B:
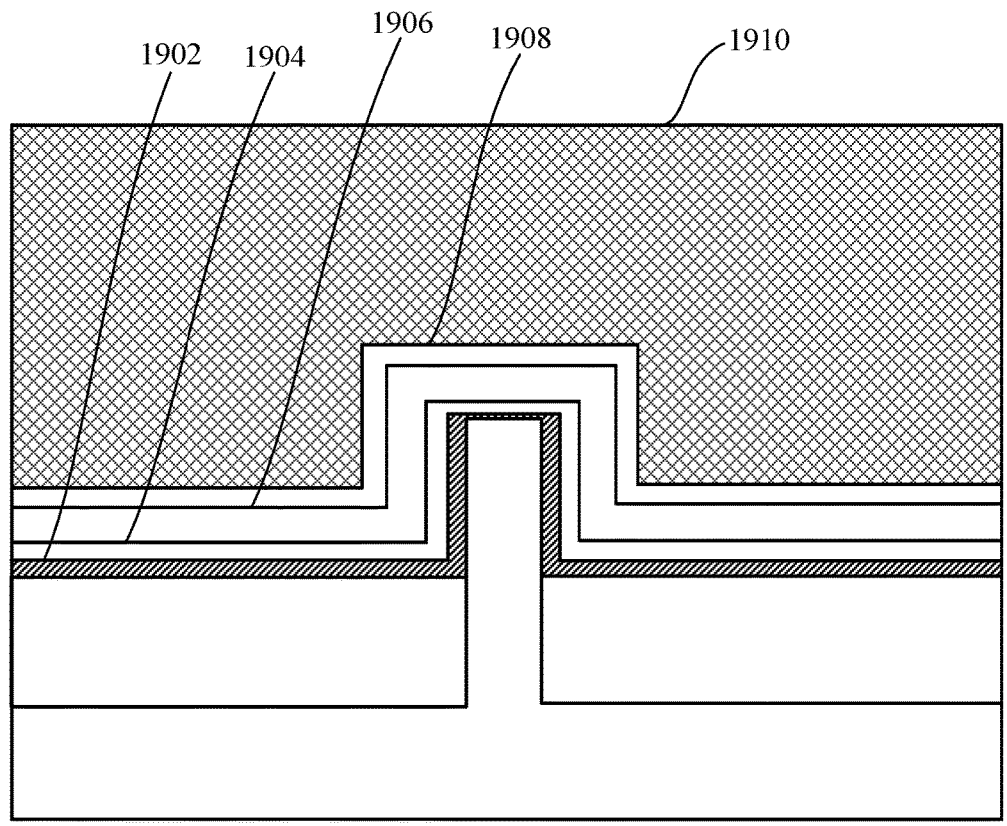
FIG. 19B is a side cross-sectional view, on the FIG. 19A cut plane 12-12.
Figure 19C:
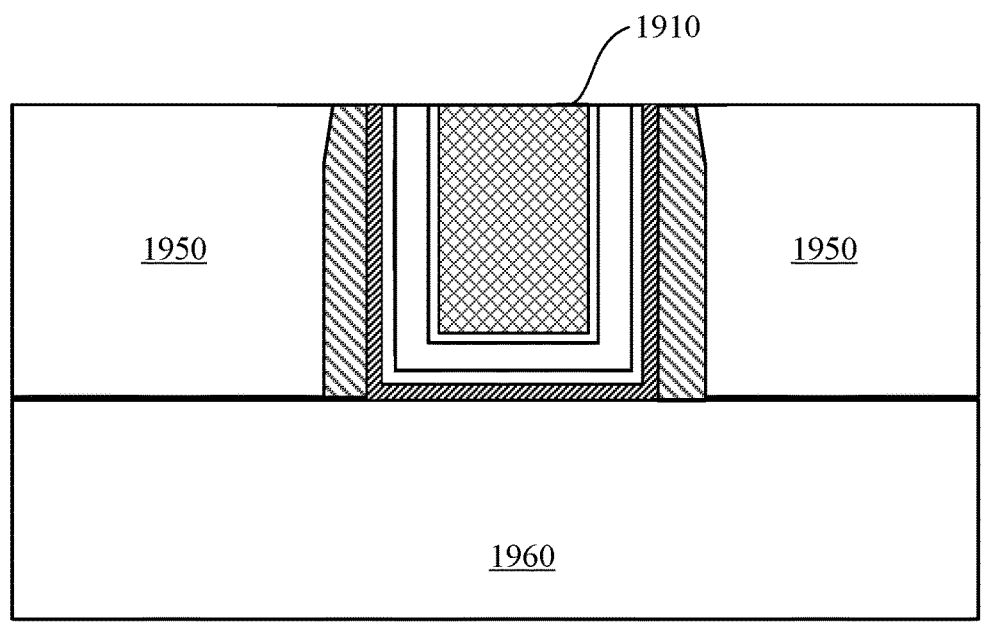
FIG. 19C is a front cross-sectional view, on the FIG. 19A cut plane 13-13.

FIG. 19A shows a top projection view of any of various different Vt PMOS FinFETs, e.g., any of the in-process structures 1600, 1700 or 1800, after removal of dummy gate and formation of a channel stack. FIG. 19B is a side cross-sectional view, on the FIG. 19A cut plane 12-12. FIG. 19C is a front cross-sectional view, on the FIG. 19A cut plane 13-13. Referring to FIG. 19A and FIG. 19B, the channel stack may include a high-K dielectric layer 1902, a capping layer 1904, a work-function metal layer 1906, a barrier layer 1908 and a gate electrode 1910. Referring to FIG. 19C, the ILD0 1950 may be deposited by conventional ILD0 deposition techniques. The fin 1960 as shown in FIG. 19C may be any of the above-described fins 1302, 1402 or 1502. FIG. 19B is a side cross-sectional view, on the FIG. 19A cut plane 12-12. FIG. 19C is a front cross-sectional view, on the FIG. 19A cut plane 13-13.

Figure 20:
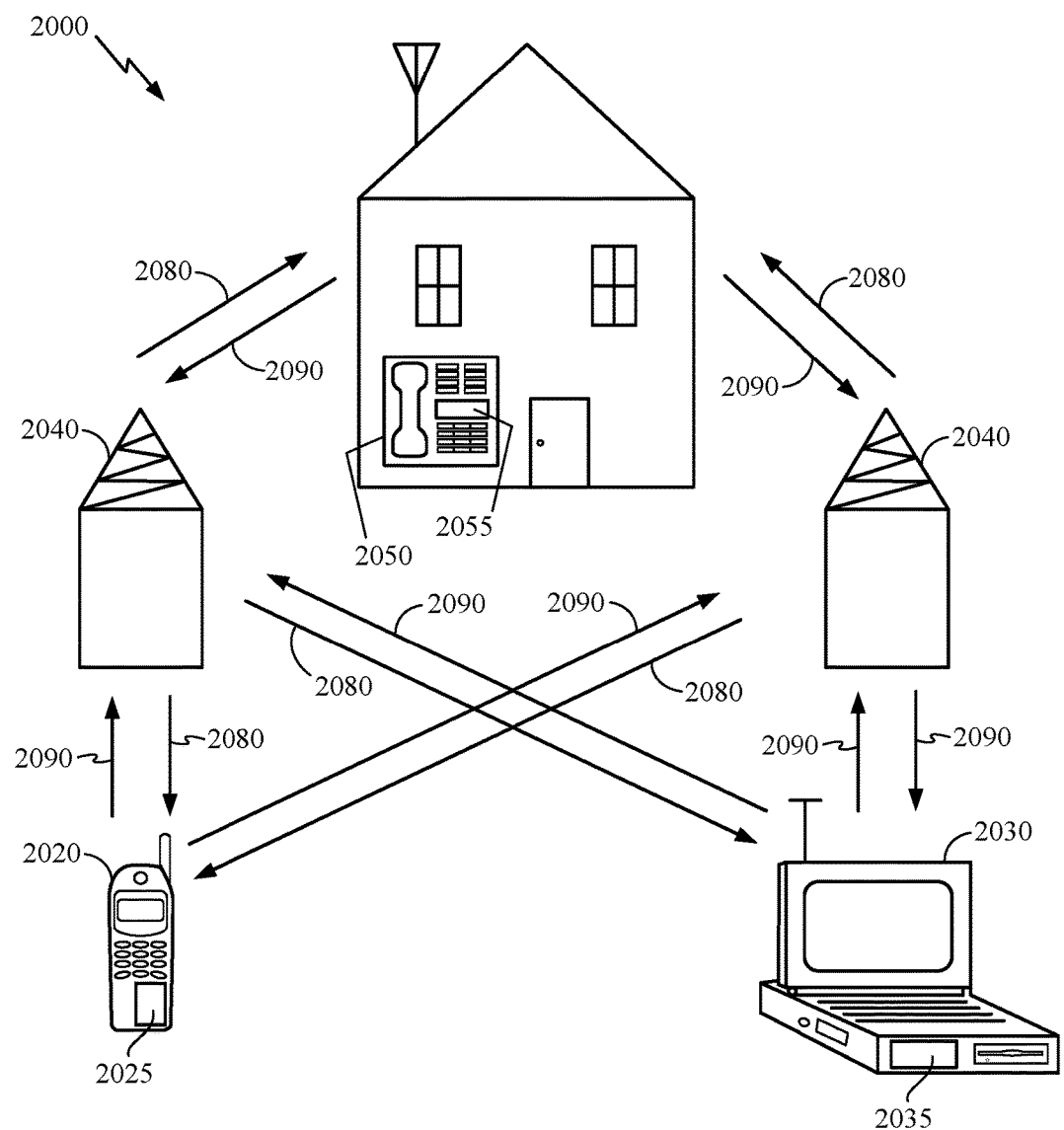
FIG. 20 shows a functional schematic of one example system of communication and computing devices having combinations of multi-Vt FinFET devices in accordance with one or more exemplary embodiments.

FIG. 20 illustrates an exemplary wireless communication system 2000 in which one or more embodiments of the disclosure may be advantageously employed. For purposes of illustration, FIG. 20 shows three remote units 2020, 2030, and 2050 and two base stations 2040. It will be recognized that conventional wireless communication systems may have many more remote units and base stations. The remote units 2020, 2030, and 2050 include integrated circuit or other semiconductor devices 2025, 2035 and 2055 which are among embodiments of the disclosure as discussed further below. FIG. 20 shows forward link signals 2080 from the base stations 2040 to the remote units 2020, 2030, and 2050 and reverse link signals 2090 from the remote units 2020, 2030, and 2050 to the base stations 2040.

In FIG. 20, the remote unit 2020 is shown as a mobile telephone, the remote unit 2030 is shown as a portable computer, and the remote unit 2050 is shown as a fixed location remote unit in a wireless local loop system. For example, the remote units may be any one or combination of a mobile phone, hand-held personal communication system (PCS) unit, portable data unit such as a personal data assistant (PDA), navigation device (such as GPS enabled devices), set top box, music player, video player, entertainment unit, fixed location data unit such as meter reading equipment, or any other device that stores or retrieves data or computer instructions, or any combination thereof. Although FIG. 20 illustrates remote units according to the teachings of the disclosure, the disclosure is not limited to these exemplary illustrated units. Embodiments of the disclosure may be suitably employed in any device which includes active integrated circuitry including memory and on-chip circuitry for test and characterization.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for implementation. Accordingly, the invention is not limited to illustrated examples and any means for performing the functionality described herein are included in embodiments of the invention.

The foregoing disclosed devices and functionalities may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An apparatus having multiple n-channel metal-oxide-semiconductor (NMOS) fin-shaped field effect transistors (FinFETs) with different threshold voltages comprising:
a first NMOS FinFET comprising:
 a first fin; and
 a first gate stack formed over a gate surface of the first fin, wherein the first gate stack comprises a first portion of a high-K dielectric layer that is formed directly on the gate surface of the first fin, a first portion of a capping layer, a first portion of a work-function metal layer formed from a work-function metal, a first barrier layer formed from a barrier layer material, and a first gate electrode metal, and wherein the first portion of the work-function metal layer is formed directly on the first portion of the capping layer and the first portion of the capping layer comprises the barrier layer material; and
a second NMOS FinFET comprising:
 a second fin; and
 a second gate stack formed over a gate surface of the second fin, wherein the second gate stack comprises a second portion of the high-K dielectric layer that is formed directly on the gate surface of the second fin, a second portion of the capping layer, a second portion of the work-function metal layer formed from the work-function metal, a second barrier layer formed from an oxide of the work-function metal, and a second gate electrode metal, and wherein the first portion of the capping layer and the second portion of the capping layer have a substantially identical thickness, and wherein the second portion of the work-function metal layer is formed directly on the second portion of the capping layer, wherein the first NMOS FinFET has a first threshold voltage, and wherein the second NMOS FinFET has a second threshold voltage that differs from the first threshold voltage.

2. The apparatus recited in claim 1, wherein the first portion of the work-function metal layer has a first thickness, and wherein the second portion of the work-function metal layer has a second thickness that is less than the first thickness.

3. The apparatus recited in claim 2, wherein the second barrier layer has a thickness approximately equal to a difference between the first thickness and the second thickness.

4. The apparatus recited in claim 1, wherein the barrier layer material from which the first barrier layer is formed comprises titanium nitride (TiN) and the oxide of the work-function metal from which the second barrier layer is formed comprises titanium aluminum oxide (TiAlO$_x$).

5. The apparatus recited in claim 1, wherein the work-function metal comprises titanium aluminide (TiAl).

6. The apparatus recited in claim 1, wherein the first portion of the high-K dielectric layer and the second portion of the high-K dielectric layer each comprises hafnium oxide (HfO$_2$), and wherein the first portion of the capping layer and the second portion of the capping layer each comprises titanium nitride (TiN).

* * * * *